(12) United States Patent
Choi et al.

(10) Patent No.: US 11,651,712 B2
(45) Date of Patent: May 16, 2023

(54) DISPLAY PANEL AND DISPLAY DEVICE

(71) Applicant: SAMSUNG DISPLAY CO., LTD., Yongin-si (KR)

(72) Inventors: Yunmi Choi, Yongin-si (KR); Guanghai Jin, Yongin-si (KR); Hyunjung Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/555,652

(22) Filed: Dec. 20, 2021

(65) Prior Publication Data
US 2022/0208031 A1    Jun. 30, 2022

(30) Foreign Application Priority Data

Dec. 30, 2020  (KR) .................. 10-2020-0188568
Jan. 28, 2021  (KR) .................. 10-2021-0012656

(51) Int. Cl.
| | |
|---|---|
| *G06F 3/041* | (2006.01) |
| *G09F 9/30* | (2006.01) |
| *G06F 1/16* | (2006.01) |
| *H01L 51/00* | (2006.01) |
| *H01L 27/32* | (2006.01) |

(52) U.S. Cl.
CPC ............ *G09F 9/301* (2013.01); *G06F 1/1652* (2013.01); *H01L 27/32* (2013.01); *H01L 51/0097* (2013.01); *H01L 2227/326* (2013.01); *H01L 2251/5338* (2013.01)

(58) Field of Classification Search
CPC .............. G09F 9/301; G06F 1/1652; G06F 2203/04102; H01L 27/32; H01L 51/0097; H01L 2227/326; H01L 2251/5338
See application file for complete search history.

(56) References Cited

U.S. PATENT DOCUMENTS

| | | | |
|---|---|---|---|
| 9,195,272 B2 * | 11/2015 | O'Brien .................. | G06F 1/1652 |
| 10,194,543 B2 * | 1/2019 | Seo ........................ | G06F 1/1626 |
| 10,410,549 B1 * | 9/2019 | Kim ........................ | G09F 11/02 |

(Continued)

FOREIGN PATENT DOCUMENTS

| | | |
|---|---|---|
| CN | 111816080 | 10/2020 |
| CN | 112002237 | 11/2020 |

(Continued)

*Primary Examiner* — Joe H Cheng
(74) *Attorney, Agent, or Firm* — F. Chau & Associates, LLC

(57) ABSTRACT

A display panel comprising a first display area, a second display area including a through portion, and a third display area disposed between the first display area and the second display area. The display panel further comprises a substrate extending continuously from the first display area to the third display area and separating the substrate in the second display area. A plurality of display elements is arranged on the substrate and includes a first display element, a second display element, and a plurality of third display elements. An organic insulating layer is arranged between the substrate and the plurality of display elements and includes a second display area hole disposed between the second display element and the through portion, and a third display area hole disposed between adjacent third display elements of the plurality of third display elements.

20 Claims, 15 Drawing Sheets

(56) References Cited

U.S. PATENT DOCUMENTS

| | | | |
|---|---|---|---|
| 10,706,785 B2* | 7/2020 | Kim | G09G 3/3275 |
| 10,743,427 B2* | 8/2020 | Huang | H05K 5/03 |
| 11,029,733 B2* | 6/2021 | Lee | G06F 1/1652 |
| 11,058,018 B1* | 7/2021 | Yoon | H05K 5/0217 |
| 11,194,363 B2* | 12/2021 | Kim | G06F 1/1637 |
| 11,297,723 B2* | 4/2022 | Ahn | G06F 1/1652 |
| 11,315,443 B2* | 4/2022 | Han | G06F 1/1652 |
| 2016/0100478 A1* | 4/2016 | Lee | G06F 1/1624 |
| | | | 361/749 |
| 2018/0049328 A1* | 2/2018 | Choi | G06F 1/1652 |
| 2020/0050285 A1 | 2/2020 | Kwon et al. | |
| 2021/0118865 A1 | 4/2021 | Ding et al. | |
| 2021/0135151 A1 | 5/2021 | Baek et al. | |
| 2021/0352813 A1* | 11/2021 | Cho | G06F 1/1656 |

FOREIGN PATENT DOCUMENTS

| | | |
|---|---|---|
| KR | 10-2016-0150533 | 12/2016 |
| KR | 10-2019-0016119 | 2/2019 |
| KR | 10-2019-0091711 | 8/2019 |

* cited by examiner

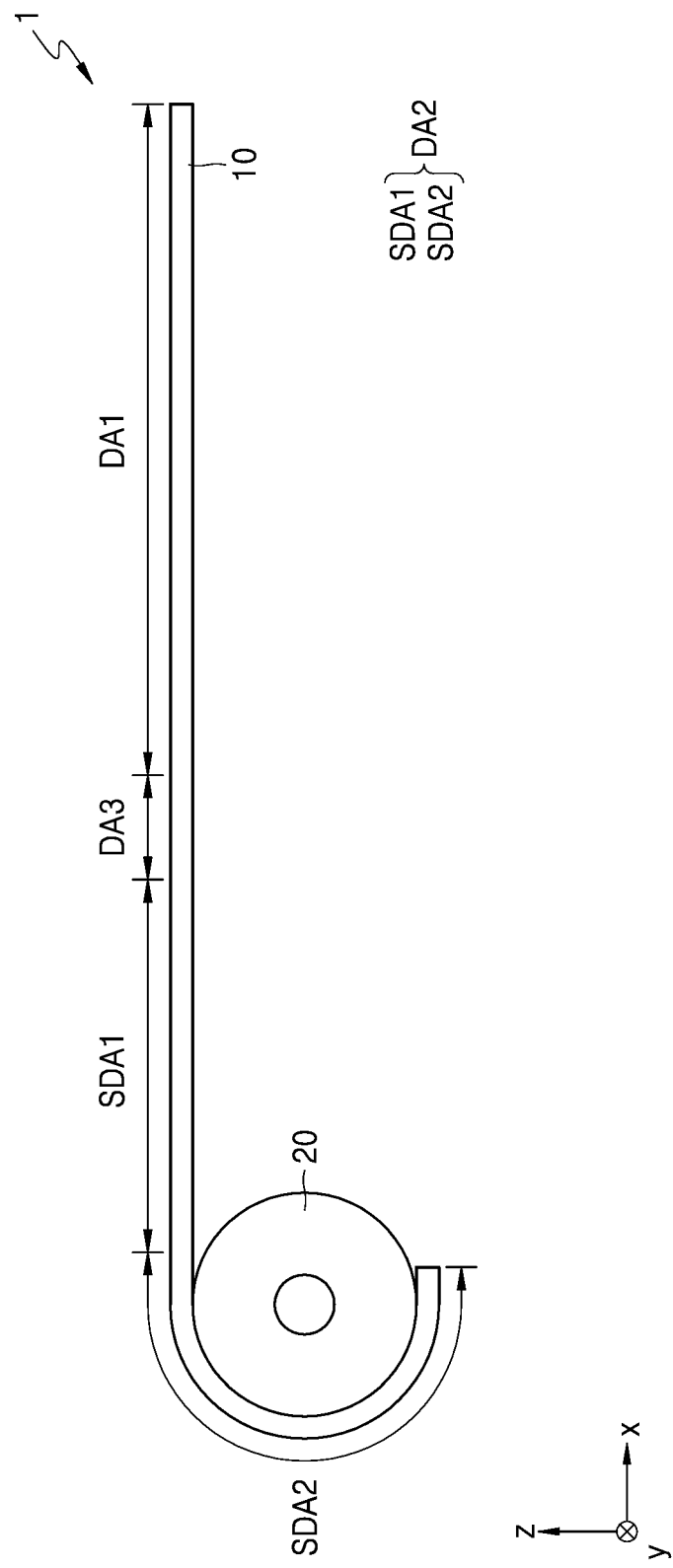

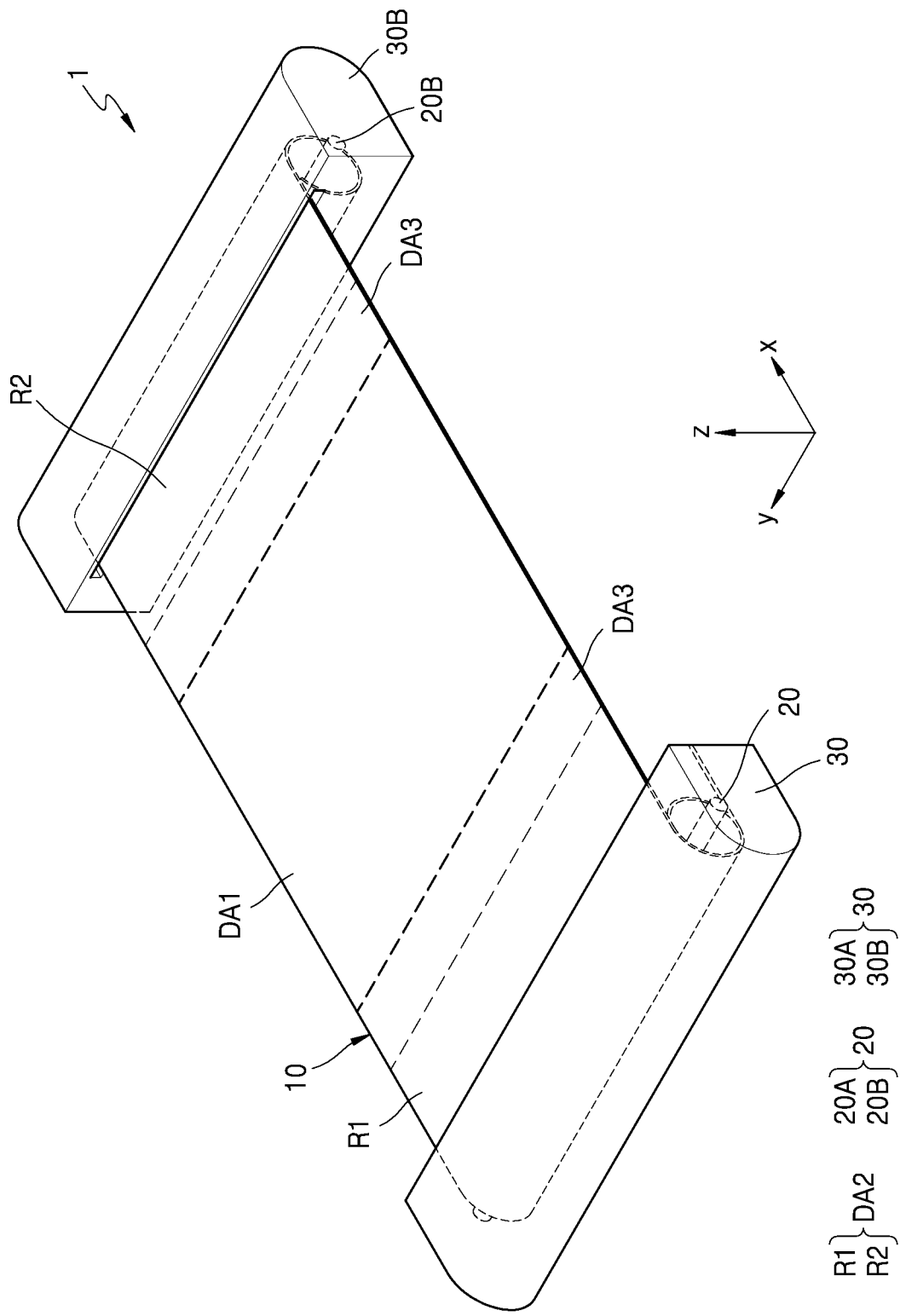

DISPLAY PANEL AND DISPLAY DEVICE

CROSS-REFERENCE TO RELATED APPLICATIONS

This application claims priority under 35 U.S.C. § 119 to Korean Patent Application Nos. 10-2020-0188568 and 10-2021-0012656, respectively field on Dec. 30, 2020 and Jan. 28, 2021, in the Korean Intellectual Property Office, the disclosures of which are incorporated by reference in their entirety herein.

1. TECHNICAL FIELD

One or more embodiments of the present inventive concepts relate to a display panel and a display device.

2. DISCUSSION OF RELATED ART

Display devices are electronic devices that display images based on electrical signals. Display device have been developed to have certain characteristics, such as a reduced thickness, a lighter weight, and a lower power consumption. For example, flexible display devices have been developed that are foldable, rollable in a roll shape by using a roller, and/or slidable.

Stress acting on portions of a display panel in contact with a roller may be relatively high. Additionally, the display panel may be stretched as the display panel moves along a curved surface. Therefore, there is an increased probability that portions of the display panel in direct contact with the roller may crack or be otherwise damaged.

SUMMARY

One or more embodiments of the present inventive concepts provide a display panel and a display device, in which cracks caused during movement along a curved surface of a roller may be prevented or reduced from occurring.

Additional aspects will be set forth in part in the description which follows and, in part, will be apparent from the description, or may be learned by practice of embodiments of the present inventive concepts.

According to an embodiment of the present inventive concepts, a display panel includes a first display area, a second display area including a through portion, and a third display area disposed between the first display area and the second display area. The display panel further comprises a substrate extending continuously from the first display area to the third display area. The through portion separates the substrate in the second display area. A plurality of display elements is arranged on the substrate. The plurality of display elements includes a first display element arranged in the first display area, a second display element arranged in the second display area, and a plurality of third display elements arranged in the third display area. An organic insulating layer is arranged between the substrate and the plurality of display elements. The organic insulating layer includes a second display area hole disposed between the second display element and the through portion, and a third display area hole disposed between adjacent third display elements of the plurality of third display elements.

In an embodiment, the display panel may further include an inorganic insulating layer between the substrate and the organic insulating layer, and the inorganic insulating layer may extend from the first display area to the third display area, and may be separated into two parts in the second display area with the through portion therebetween.

In an embodiment, the display panel may further include a pattern layer arranged on the organic insulating layer, and the pattern layer may be between the first display element and any one of the plurality of third display elements that faces the first display element.

In an embodiment, the display panel may further include an encapsulation layer arranged on the plurality of display elements, and including at least one inorganic encapsulation layer and at least one organic encapsulation layer, and the at least one organic encapsulation layer may be separated based on the pattern layer.

In an embodiment, the display panel may further include a pixel circuit electrically connected to any one of the plurality of display elements, and a wire between the substrate and the pattern layer, and the wire may be electrically connected to the pixel circuit.

In an embodiment, the display panel may further include an intermediate pattern layer arranged on the organic insulating layer, and the intermediate pattern layer may be between the plurality of third display elements adjacent to each other.

In an embodiment, the display panel may further include an inorganic layer between the organic insulating layer and any one of the plurality of third display elements, and the inorganic layer may include a protruding tip protruding in a center direction of the third display area hole.

In an embodiment, the second display area may include a first pixel area, a second pixel area, and a connection area extending from the first pixel area to the second pixel area, and an edge of the first pixel area, an edge of the connection area, and an edge of the second pixel area may define at least a portion of the through portion.

In an embodiment, the second display area may include a first sub-display area and a second sub-display area, the through portion may include a first through portion overlapping the first sub-display area, and a second through portion overlapping the second sub-display area, and a size of the first through portion may be greater than a size of the second through portion.

In an embodiment, the third display area may include a first intermediate display area and a second intermediate display area, the first intermediate display area may be arranged closer to the first display area than the second intermediate display area, and a density of the plurality of third display elements arranged in the first intermediate display area may be greater than a density of the plurality of third display elements arranged in the second intermediate display area.

According to an embodiment of the present inventive concepts, a display device includes a display panel including a first display area and a second display area. The display device further includes a roller for rolling the second display area therearound. The second display area includes a through portion entirely penetrating the display panel.

In an embodiment, the second display area may include a first pixel area, a second pixel area, and a connection area extending from the first pixel area to the second pixel area, and an edge of the first pixel area, an edge of the connection area, and an edge of the second pixel area may define at least a portion of the through portion.

In an embodiment, the display panel may further include a substrate, an organic insulating layer arranged on the substrate and including a second display area hole overlapping the second display area, a plurality of display elements arranged on the organic insulating layer, and including a first display element arranged in the first display area, and a second display element arranged in the second display area, and an inorganic layer overlapping the second display area, arranged between the organic insulating layer and the second display element, and including a protruding tip protruding in a center direction of the second display area hole.

In an embodiment, the display panel may further include a third display area between the first display area and the second display area, the display panel further including a substrate extending from the first display area to the third display area, and separated into two parts in the second display area with the through portion therebetween, a plurality of display elements arranged on the substrate, and including a first display element arranged in the first display area, a second display element arranged in the second display area, and a plurality of third display elements arranged in the third display area, an encapsulation layer arranged on the plurality of display elements, and including at least one inorganic encapsulation layer and at least one organic encapsulation layer, and a pattern layer between the first display element and any one of the plurality of third display elements that faces the first display element, the pattern layer separating the at least one organic encapsulation layer.

In an embodiment, the display panel may further include a pixel circuit electrically connected to any one of the plurality of display elements, and a wire between the substrate and the pattern layer, and the wire may be electrically connected to the pixel circuit.

In an embodiment, the display panel may further include a third display area between the first display area and the second display area, the third display area may include a first intermediate display area and a second intermediate display area, the first intermediate display area may be arranged closer to the first display area than the second intermediate display area, and a density of sub-pixels arranged in the first intermediate display area may be greater than a density of sub-pixels arranged in the second intermediate display area.

In an embodiment, the display device may include a first state in which the second display area is rolled around the roller, and a second state in which the second display area is at least partially unrolled from the roller.

In an embodiment, the second display area may include a first sub-display area in contact with the roller in the first state, and a second sub-display area extending from the first sub-display area, the through portion may include a first through portion overlapping the first sub-display area, and a second through portion overlapping the second sub-display area, and a size of the first through portion may be greater than a size of the second through portion.

In an embodiment, in the first state, at least a portion of the second sub-display area may be arranged under the first display area.

In an embodiment, the second display area may include a first area and a second area arranged with the first display area therebetween, the roller may include a first roller and a second roller, the first roller may roll the first area therearound, and the second roller may roll the second area therearound.

BRIEF DESCRIPTION OF THE DRAWINGS

The above and other aspects, features, and advantages of embodiments of the present inventive concepts will be more apparent from the following description taken in conjunction with the accompanying drawings, in which:

FIGS. 2A and 2B are cross-sectional views of a portion of a display device, according to embodiments of the present inventive concepts;

FIGS. 12A and 12B are perspective views of a display device, according to embodiments of the present inventive concepts.

DETAILED DESCRIPTION OF EMBODIMENTS

Figure 1A:
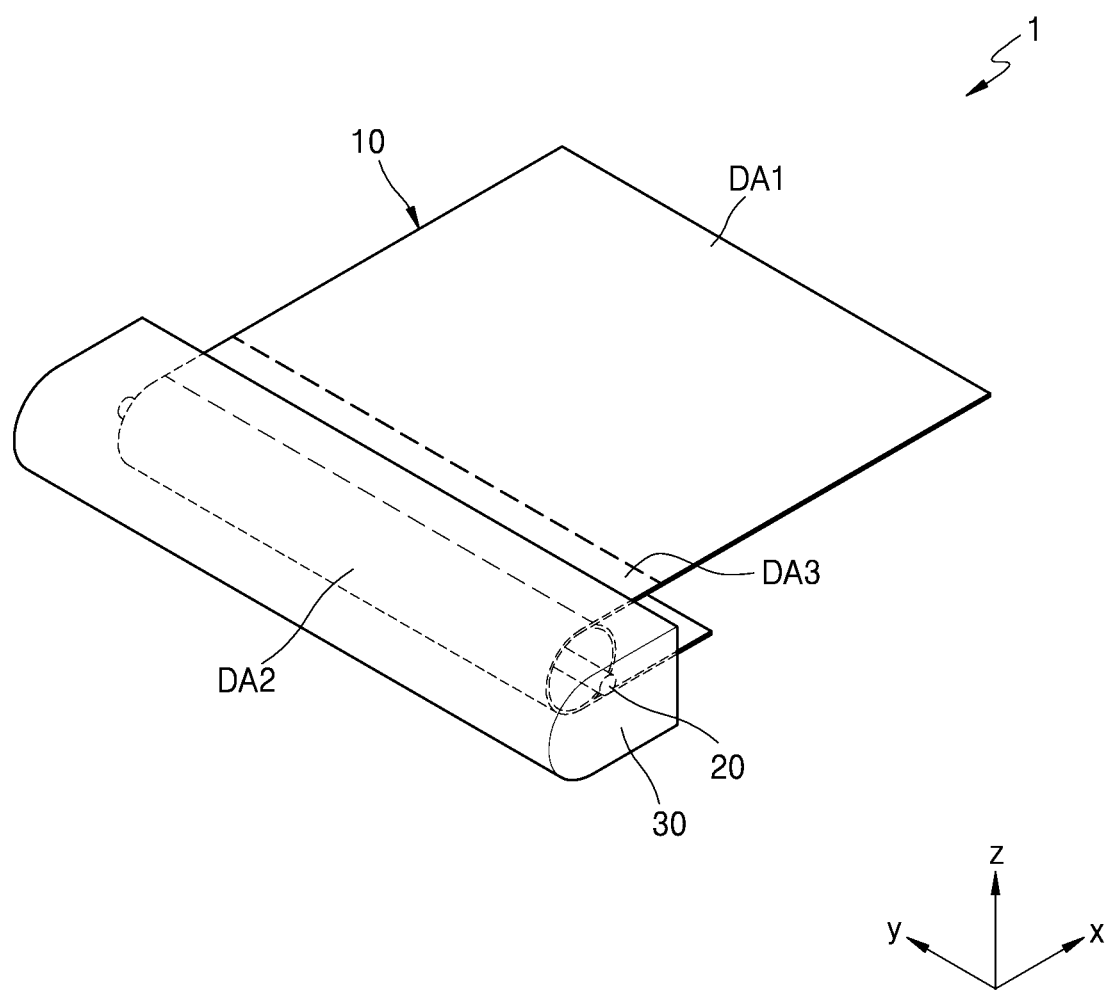
FIGS. 1A and 1B are schematic perspective views of a display device according to embodiments of the present inventive concepts.

Reference will now be made in detail to embodiments, examples of which are illustrated in the accompanying drawings, wherein like reference numerals refer to like elements throughout the present disclosure. In this regard, embodiments of the present inventive concepts may have different forms and configuration and should not be construed as being limited to the descriptions set forth herein. Accordingly, the embodiments are merely described below, by referring to the figures, to explain aspects of the present inventive concepts and are not limiting. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or any variations thereof.

Since the present inventive concepts may have various modifications and embodiments, specific embodiments are illustrated in the drawings and will be described in detail in the detailed description. Effects and features of the present inventive concepts, and methods for achieving them will be clarified with reference to embodiments described below in detail with reference to the drawings. However, the present inventive concepts are not limited to the following embodiments and may be embodied in various forms.

One or more embodiments of the present inventive concepts will be described below in more detail with reference to the accompanying drawings. Those elements that are the same or are in correspondence with each other are rendered the same reference numeral regardless of the figure number, and redundant explanations are omitted.

While such terms as "first," "second," etc., may be used to describe various elements, such elements are not to be limited to the above terms. The above terms are used only to distinguish one element from another.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be understood that when a layer, region, or element is referred to as being "formed on" or "disposed on" another layer, region, or element, it can be directly or indirectly formed on or disposed on the other layer, region, or element. That is, for example, intervening layers, regions, or elements may be present. However, when a layer, region, or element is referred to as being "formed directly on" or "disposed directly on" another layer, region, or element, no intervening layers, regions or elements may be present.

Sizes of elements in the drawings may be exaggerated or contracted for convenience of explanation. For example, because sizes and thicknesses of elements in the drawings are arbitrarily illustrated for convenience of explanation, the present inventive concepts are not limited thereto.

When an embodiment may be implemented differently, a process order may be performed differently from the described order. For example, two processes described in succession may be performed substantially simultaneously, or may be performed in an order opposite to that described.

In the following embodiments, it will be understood that when a layer, region, or element is referred to as being "connected to" or "coupled to" another layer, region, or element, it may be directly or indirectly connected or coupled to the other layer, region, or element. That is, for example, intervening layers, regions, or elements may be present. When a layer, region, or element is referred to as being "directly connected to" or "directly coupled to" another layer, region, or element, no intervening layer, region or element may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. That is, for example, intervening layers, regions, or elements may be present.

A display device is a device for displaying at least one moving image and/or a still image, and may be used as a display screen of not only portable electronic devices, such as a mobile phone, a smartphone, a tablet personal computer (PC), a mobile communication terminal, an electronic notebook, an electronic book, a portable multimedia player (PMP), a navigation device, and an ultra mobile PC (UMPC), but also various other small, medium or large electronic products, such as a television, a laptop computer, a monitor, a billboard, and Internet of things (IoT). Also, a display device according to an embodiment may be used for wearable devices, such as a smart watch, a watch phone, a glasses-type display, and a head mounted display (HMD). In addition, a display device according to an embodiment may be used as a panel of a vehicle, a center information display (CID) arranged on a center fascia or dashboard of a vehicle, a rear-view mirror display replacing a side mirror of a vehicle, or a display arranged on a rear surface of a front seat, as entertainment for a back seat of a vehicle.

Figure 1B:
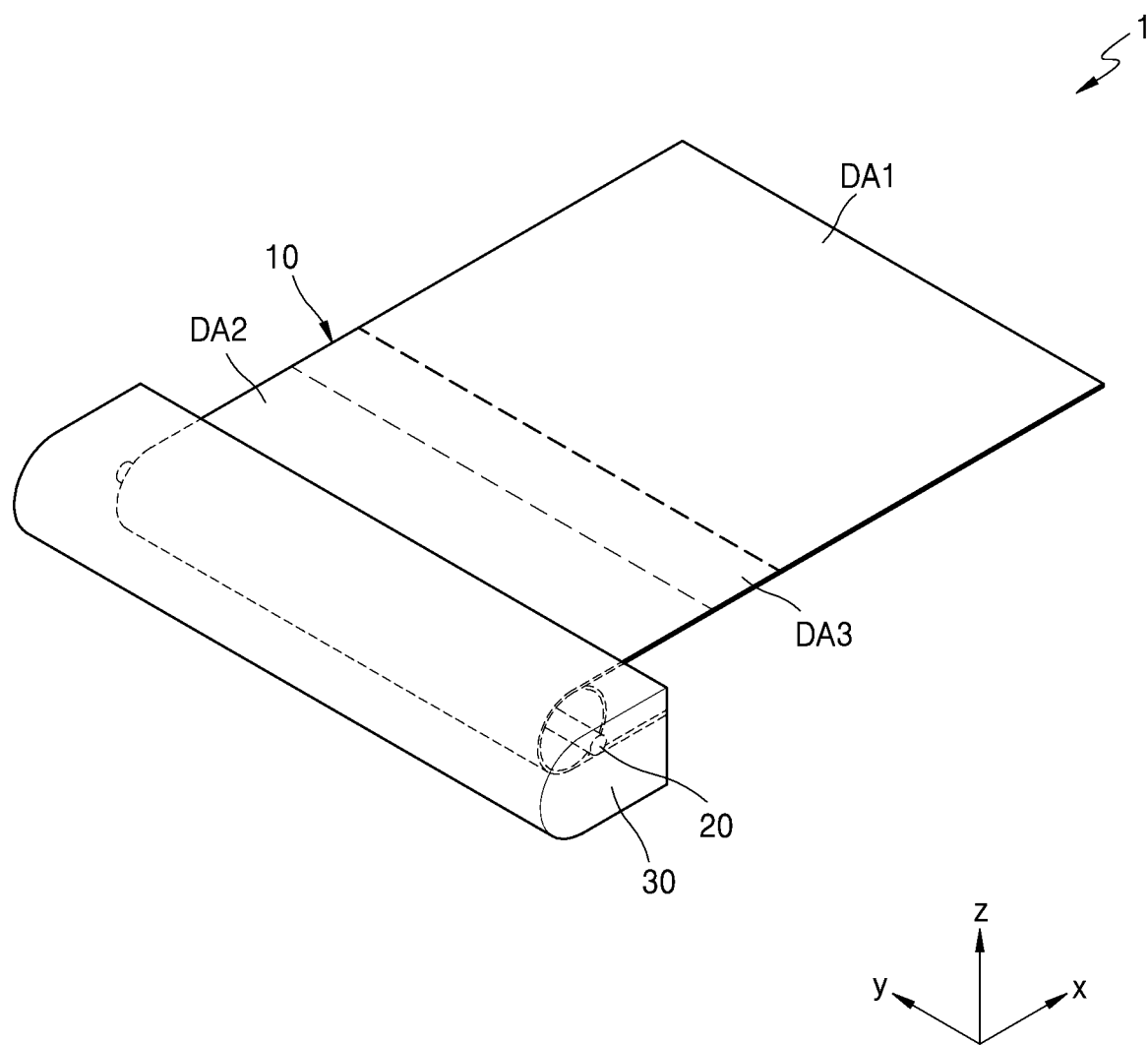
Figure 2A:
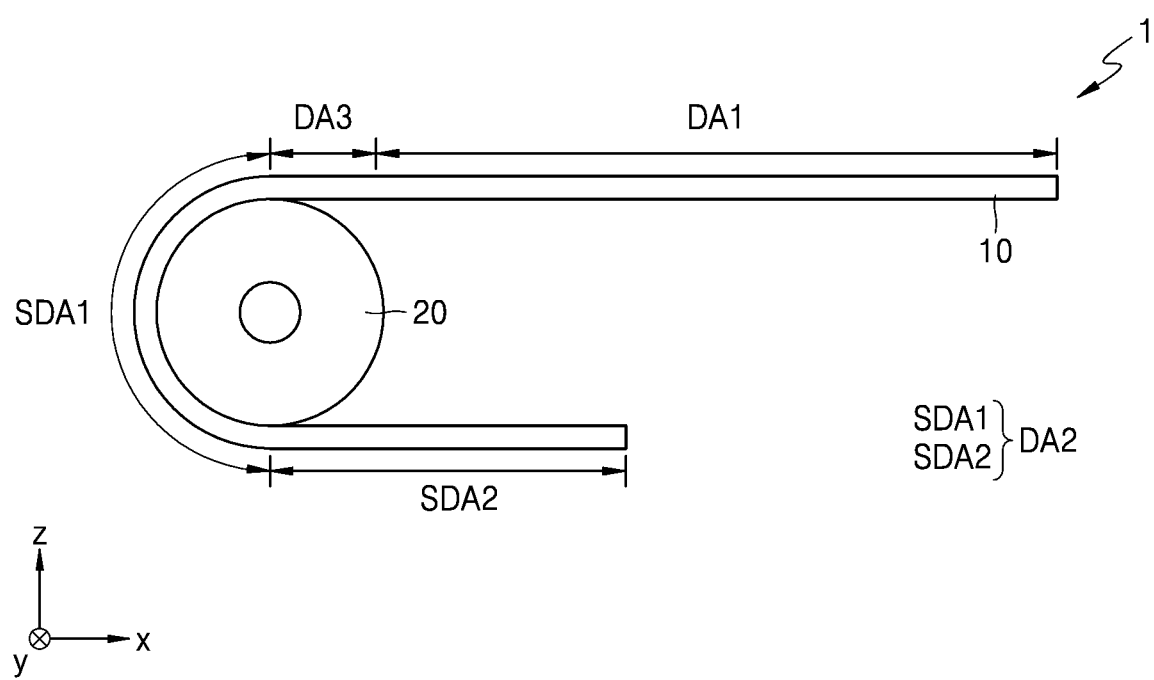

FIGS. 1A and 1B are schematic perspective views of a display device 1 according to embodiments of the present inventive concepts. FIGS. 2A and 2B are schematic cross-sectional views of a portion of a display device 1, according to embodiments of the present inventive concepts.

FIGS. 1A and 2A are a perspective view and a cross-sectional view of a first state in which a second display area DA2 is rolled, respectively, and FIGS. 1B and 2B are a perspective view and a cross-sectional view of a second state in which the second display area DA2 is unrolled, respectively.

Referring to FIGS. 1A, 1B, 2A, and 2B, the display device 1 may include a display panel 10, a roller 20, and a cover 30.

The display panel 10 may display an image. The display panel 10 may include a first display area DA1, the second display area DA2, and a third display area DA3. The first display area DA1, the second display area DA2, and the third display area DA3 may be areas that display an image and may each include a plurality of pixels emitting light.

In an embodiment, the first display area DA1 may be a main display area. In an embodiment, the first display area DA1 may be flat, and a majority of the images displayed by the display panel 10 may be displayed in the first display area DA1.

As shown in the embodiments of FIGS. 1A, 2A, the second display area DA2 may be rolled around the roller 20. The second display area DA2 may be wound along an outer circumferential surface of the roller 20. The second display area DA2 may be rolled around or unrolled from the roller 20. For example, the second display area DA2 may be rolled up or unrolled by the roller 20. In the present specification, the meaning of the second display area DA2 being rolled around the roller 20 may be the second display area DA2 is rolled over along the outer circumferential surface of the roller 20 like a conveyor belt. Also, the meaning of the second display area DA2 being rolled around the roller 20 may be the second display area DA2 wound in a scroll shape along the outer circumferential surface of the roller 20.

In an embodiment, a portion of the second display area DA2 may overlap at least one of the first display area DA1 and the third display area DA3. For example, the portion of the second display area DA may overlap at least one of the first display area DA1 and the third display area DA3 in a third direction parallel to the z axis (hereinafter, the "Z direction"). In this embodiment, the portion of the second display area DA2 may be arranged under at least one of the first display area DA1 and the third display area DA3.

As shown in the embodiment of FIG. 2A, the second display area DA2 may include a first sub-display area SDA1 and a second sub-display area SDA2 that are disposed adjacent to each other. In an embodiment, the first sub-display area SDA1 may be arranged closer to the first display area DA1 than the second sub-display area SDA2.

The third display area DA3 may be disposed between the first display area DA1 and the second display area DA2. The third display area DA3 may extend from the first display area DA1 to the second display area DA2. However, embodiments of the present inventive concepts are not limited thereto. For example, in some embodiments, the third display area DA3 may be omitted.

The roller 20 may roll the second display area DA2 therearound. In an embodiment, the roller 20 may be connected to a driver. The driver may include a motor or the like and may rotate the roller 20. However, embodiments of the present inventive concepts are not limited thereto. For example, in an embodiment, the second display area DA2 may be manually rolled or unrolled around the roller 20.

The cover 30 may accommodate the roller 20. Accordingly, a portion of the display panel 10 may be accommodated in the cover 30. For example, the portion of the display panel 10 may be carried into the cover 30 or carried out of the cover 30.

The display device 1 may be configured to operate in the first state and the second state. The first state may be a state in which the second display area DA2 is rolled around the roller 20 as shown in the embodiments of FIGS. 1A and 2A. The second state may be a state in which the second display area DA2 is at least partially unrolled from the roller 20 as shown in the embodiments of FIGS. 1B and 2B.

Referring to the embodiments of FIGS. 1A and 2A, the second display area DA2 may be rolled around the roller 20 in the first state. In these embodiments, at least a partial portion of the second display area DA2 may be accommodated in the cover 30. In the first state, the first display area DA1 and the third display area DA3 may display an image. A user may not be able to view the second display area DA2 in the first state.

The first sub-display area SDA1 may be rolled around the roller 20 in the first state. The second sub-display area SDA2 may extend from the first sub-display area SDA1. In an embodiment, the second sub-display area SDA2 may extend away from the roller 20 in the first state. That is, the second sub-display area SDA2 may not be rolled around the roller 20 in the first state. Accordingly, the second sub-display area SDA2 may not be in contact with the roller 20.

The second sub-display area SDA2 may be arranged under at least one of the first display area DA1 and the third display area DA3 in the first state. The second sub-display area SDA2 may overlap at least one of the first display area DA1 and the third display area DA3 in the Z direction. For example, as shown in the embodiment of FIG. 2A, the second sub-display area SDA2 overlaps in the Z direction both a partial portion of the first display area DA1 and an entire portion of the third display area DA3 in the first state. However, embodiments of the present inventive concepts are not limited thereto.

In an embodiment, the second sub-display area SDA2 may be rolled around the roller 20 in the first state. In this embodiment, the second display area DA2 may be rolled around the roller 20 in a scroll shape.

Referring to the embodiments of FIGS. 1B and 2B, the second display area DA2 may be at least partially unrolled from the roller 20 in the second state. In this embodiment, the first display area DA1, the second display area DA2, and the third display area DA3 may be exposed to the outside, and the first display area DA1, the second display area DA2, and the third display area DA3 may display an image. The display device 1 may provide a wide display area to a user in the second state.

The first sub-display area SDA1 may be unrolled from the roller 20 in the second state. In an embodiment, the first sub-display area SDA1 may be entirely unrolled from the roller 20 in the second state. However, embodiments of the present inventive concepts are not limited thereto. For example, the first sub-display area SDA1 may be at least partially unrolled from the roller 20 in the second state.

The second sub-display area SDA2 may be rolled around the roller 20 in the second state. In an embodiment, the second sub-display area SDA2 may be at least partially unrolled from the roller 20 in the second state.

For example, as shown in the embodiment of FIG. 2B, a partial portion of the second sub-display area SDA2 may be rolled around the roller 20 in the second state, and a remaining portion of the second sub-display area SDA2 may be unrolled from the roller 20 in the second state. In this embodiment, at least a partial portion of the second sub-display area SDA2 may be exposed to the outside together with the first display area DA1, the third display area DA3, and the first sub-display area SDA1.

Figure 3:
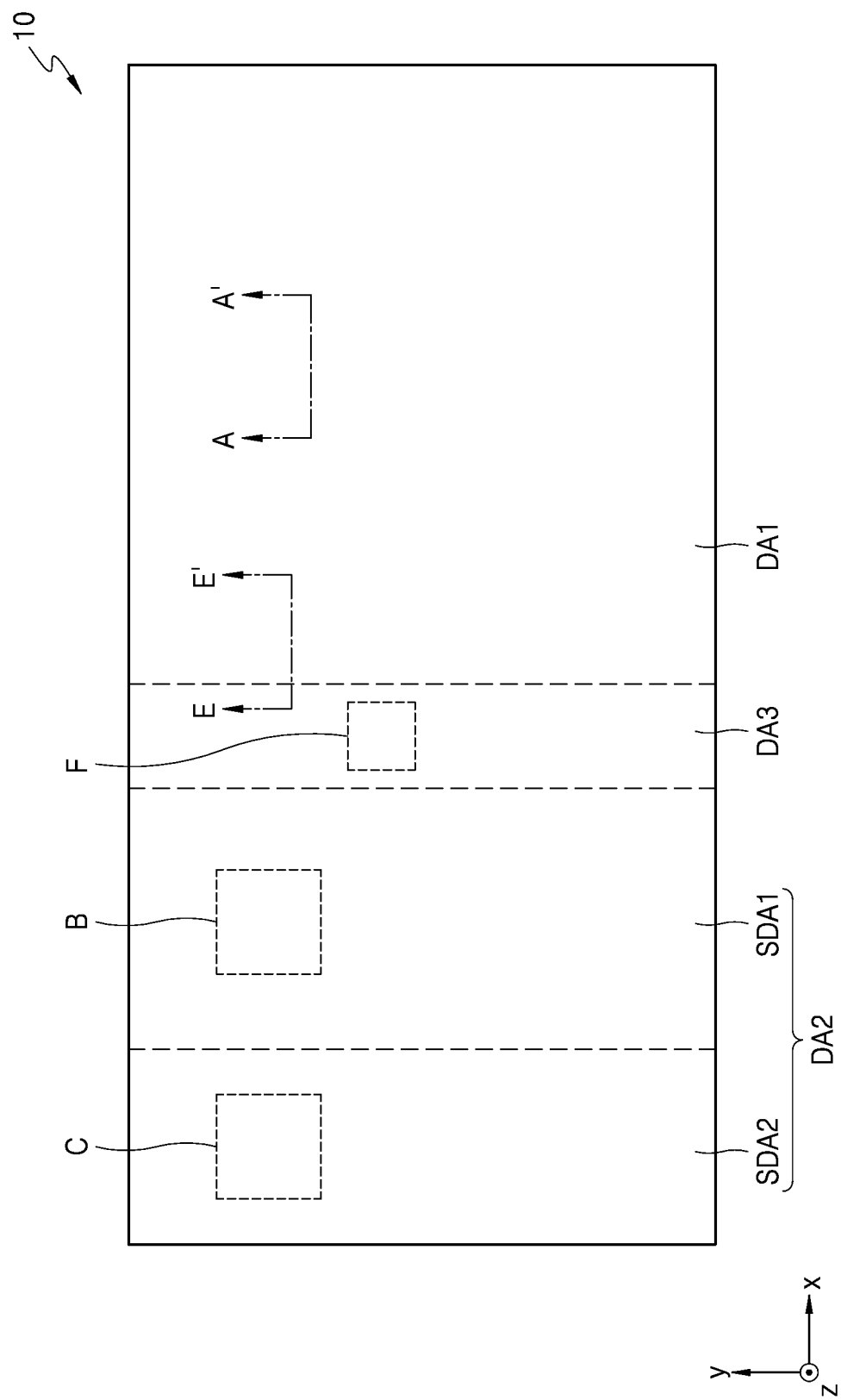
FIG. 3 is a plan view of a display panel according to an embodiment of the present inventive concepts.

FIG. 3 is a schematic plan view of a display panel 10 according to an embodiment. FIG. 3 schematically illustrates a state in which the display panel 10 is unrolled.

Referring to the embodiment of FIG. 3, the display panel 10 may include the first display area DA1, the second display area DA2, and the third display area DA3. For example, the first display area DA1, the second display area DA2 and the third display area DA3 may be arranged in a first direction parallel to the x-axis (hereinafter, the "X direction") when in an unrolled state. The first display area DA1, the second display area DA2, and the third display area DA3 may be areas that display an image and may each include a plurality of pixels emitting light.

The pixels may each include a display element. In an embodiment, the display panel 10 may include a plurality of display elements. In an embodiment, a first display element may be arranged in the first display area DA1. For example, the first display element may be provided in the first display area DA1 as a plurality of first display elements. A second display element may be arranged in the second display area DA2. For example, the second display element may be provided in the second display area DA2 as a plurality of second display elements. A third display element may be arranged in the third display area DA3. For example, the third display element may be provided in the third display area DA3 as a plurality of third display elements.

In an embodiment, the display panel 10 may be an organic light-emitting display panel using an organic light-emitting diode including an organic emission layer as a display element. However, embodiments of the present inventive concepts are not limited thereto. For example, in some embodiments, the display panel 10 may be a light-emitting diode display panel using a light-emitting diode (LED) as a display element. A size of the LED may be in micro-scale or nano-scale. For example, the LED may be a micro LED. Alternatively, the LED may be a nanorod LED. The nanorod LED may include gallium nitride (GaN). According to an embodiment, a color conversion layer may be arranged on the nanorod LED. The color conversion layer may include quantum dots. Alternatively, the display panel 10 may be a quantum dot light-emitting display panel using a quantum dot light-emitting diode including a quantum dot emission layer as a display element. Alternatively, the display panel 10 may be an inorganic light-emitting display panel using an inorganic light-emitting element including an inorganic semiconductor as a display element. Hereinafter, a case in which the display panel 10 is an organic light-emitting display panel using an organic light-emitting diode as a display element will be described in detail for convenience of explanation.

The second display area DA2 may include the first sub-display area SDA1 and the second sub-display area SDA2. The first sub-display area SDA1 may be a second display area DA2 that is arranged closer to the first display area DA1 than the second sub-display area SDA2. For example, the first sub-display area SDA1 may be between the second sub-display area SDA2 and the first display area DA1 (e.g., in the X direction when in an unrolled state). In an embodiment, the first sub-display area SDA1 may be the portion of the second display area DA2 that is rolled around the roller 20 (see FIG. 2A) in the first state.

The second sub-display area SDA2 may extend from the first sub-display area SDA1. In an embodiment, the second sub-display area SDA2 may be the portion of the second display area DA2 extending away from the roller 20 (see FIG. 2A) in the first state. The second sub-display area SDA2 may be the portion of the second display area DA2 overlapping (e.g., in the Z direction) at least one of the first display area DA1 and the third display area DA3 in the first state.

The third display area DA3 may be between the first display area DA1 and the second display area DA2 (e.g., in the X direction in an unrolled state). The third display area DA3 may extend from the first display area DA1 to the second display area DA2. For example, one lateral side of the third display area DA3 may directly contact the first display area DA1 and the opposing lateral side of the third display area DA3 may directly contact the second display area DA2.

In an embodiment, a resolution of the third display area DA3 may be higher than a resolution of the second display area DA2. In an embodiment, the resolution of the third display area DA3 may be lower than a resolution of the first display area DA1. However, embodiments of the present inventive concepts are not limited thereto.

Figure 4:
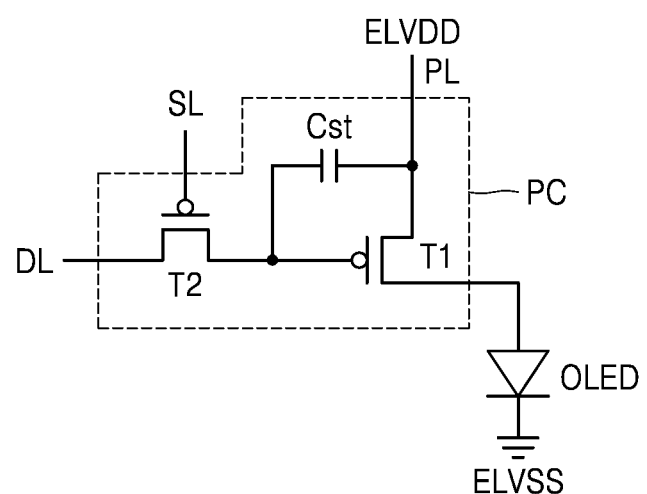
FIG. 4 is an equivalent circuit diagram of a pixel circuit applicable to a display panel, according to an embodiment of the present inventive concepts.

FIG. 4 is an equivalent circuit diagram of a pixel circuit PC applicable to a display panel, according to an embodiment.

Referring to FIG. 4, the pixel circuit PC may be connected to a display element, for example, an organic light-emitting diode OLED.

In an embodiment, the pixel circuit PC may include a driving thin-film transistor T1, a switching thin-film transistor T2, and a storage capacitor Cst. In an embodiment, the organic light-emitting diode OLED may emit red, green, or blue light or may emit red, green, blue, or white light. However, embodiments of the present inventive concepts are not limited thereto and the organic light-emitting diode OLED may emit various different colors.

The switching thin-film transistor T2 may be connected to a scan line SL and a data line DL and may be configured to transmit a data signal or a data voltage input from the data line DL to the driving thin-film transistor T1 based on a scan signal or a switching voltage input from the scan line SL. The storage capacitor Cst may be connected to the switching thin-film transistor T2 and a driving voltage line PL and may be configured to store a voltage corresponding to a difference between a voltage received from the switching thin-film transistor T2 and a first power voltage ELVDD supplied to the driving voltage line PL.

The driving thin-film transistor T1 may be connected to the driving voltage line PL and the storage capacitor Cst and may be configured to control a driving current flowing from the driving voltage line PL to the organic light-emitting diode OLED in response to a voltage value stored in the storage capacitor Cst. The organic light-emitting diode OLED may emit light having a certain luminance according to the driving current. An opposite electrode of the organic light-emitting diode OLED may receive a second power voltage ELVSS.

Though it is shown in the embodiment of FIG. 4 that the pixel circuit PC includes two thin-film transistors and one storage capacitor, the pixel circuit PC may include three or more thin-film transistors. Additionally, while the embodiment of FIG. 4 shows that the gate electrodes of the driving thin-film transistor T1 and the switching thin-film transistor T2 are each single gate electrodes, in some embodiments, the thin-film transistors may include one or more dual gate electrodes, etc.

Figure 5:
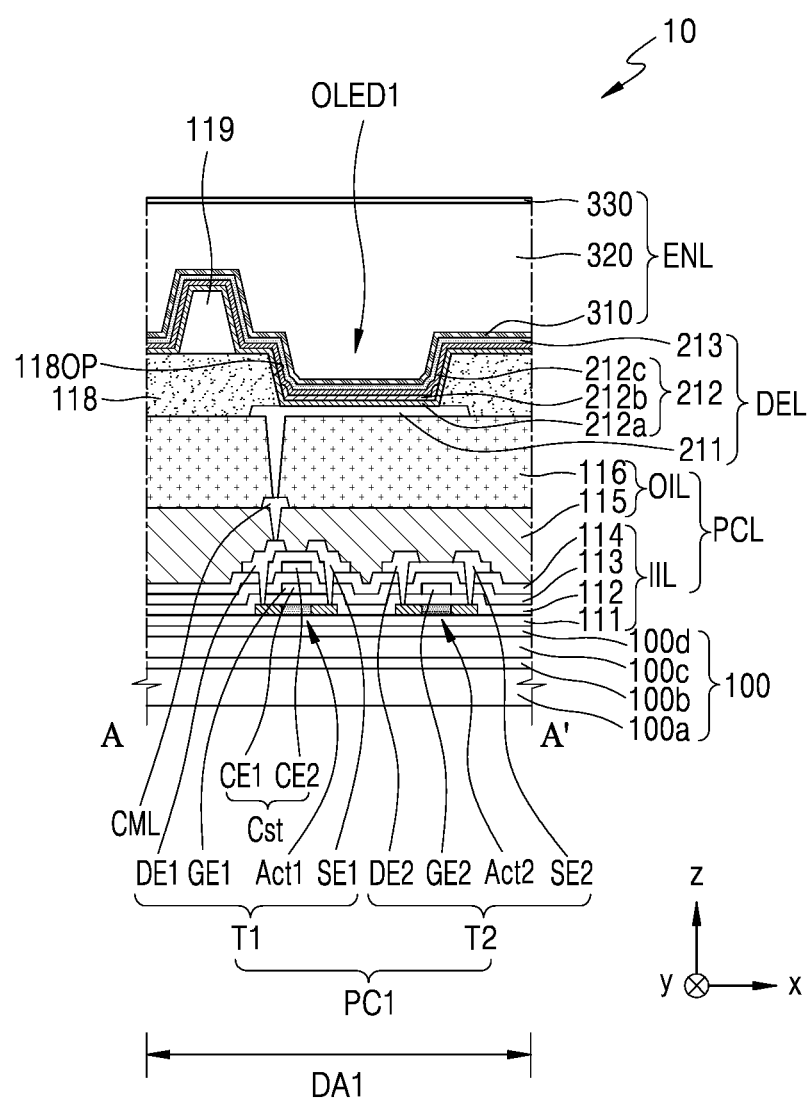
FIG. 5 is a cross-sectional view of a display panel, taken along a line A-A' of FIG. 3, according to an embodiment of the present inventive concepts.

FIG. 5 is a cross-sectional view of a display panel 10, taken along a line A-A' of FIG. 3, according to an embodiment.

Referring to FIG. 5, the display panel 10 may include a substrate 100, a pixel circuit layer PCL, a display element layer DEL, and an encapsulation layer ENL.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked on the substrate 100 (e.g., in the Z direction). However, embodiments of the present inventive concepts are not limited thereto. For example, in an embodiment, the substrate 100 may include glass.

In an embodiment, at least one of the first base layer 100a and the second base layer 100c may include a polymer resin such as at least one compound selected from polyethersulfone, polyarylate, polyetherimide, polyethylene naphthalate, polyethylene terephthalate, polyphenylene sulfide, polyimide, polycarbonate, cellulose triacetate, cellulose acetate propionate, and the like.

The first barrier layer 100b and second barrier layer 100d are barrier layers preventing penetration of an external foreign material and may each be a single layer or multi-layer including an inorganic material, such as silicon nitride ($SiN_x$), silicon oxide ($SiO_2$), and/or silicon oxynitride (SiON).

The pixel circuit layer PCL may be arranged on the substrate 100 (e.g., directly thereon in the Z direction). The pixel circuit layer PCL may include a pixel circuit. In an embodiment, the pixel circuit layer PCL may include a plurality of pixel circuits. A first pixel circuit PC1 among the pixel circuits may include the driving thin-film transistor T1, the switching thin-film transistor T2, and the storage capacitor Cst.

As shown in the embodiment of FIG. 5, the pixel circuit layer PCL may include an inorganic insulating layer IIL and an organic insulating layer OIL under and/or above the elements of the driving thin-film transistor T1. The inorganic insulating layer IIL may include a buffer layer 111, a first gate insulating layer 112, a second gate insulating layer 113, and an interlayer insulating layer 114. In an embodiment, the organic insulating layer OIL may include a first organic insulating layer 115 and a second organic insulating layer 116. The driving thin-film transistor T1 may include a first semiconductor layer Act1, a first gate electrode GE1, a first source electrode SE1, and a first drain electrode DE1.

The buffer layer 111 may be arranged on the substrate 100 (e.g., disposed directly thereon in the Z direction). In an embodiment, the buffer layer 111 may include an inorganic insulating material, such as at least one compound selected from $SiN_x$, SiON, and $SiO_2$, and may include a single layer or multi-layer including the above inorganic insulating material.

The first semiconductor layer Act1 may be arranged on the buffer layer 111 (e.g., disposed directly thereon in the Z direction). In an embodiment, the first semiconductor layer Act1 may include polysilicon. However, embodiments of the present inventive concepts are not limited thereto. For example, the first semiconductor layer Act1 may include amorphous silicon, an oxide semiconductor, or an organic semiconductor. The first semiconductor layer Act1 may include a channel region, and a drain region and a source region, which are arranged on both sides of the channel region, respectively.

The first gate electrode GE1 may overlap the channel region (e.g., in the Z direction). The first gate electrode GE1 may include a low-resistance metal material. In an embodiment, the first gate electrode GE1 may include a conductive material including at least one compound selected from molybdenum (Mo), aluminum (Al), copper (Cu), and titanium (Ti) and may include a multi-layer or single layer including the above conductive material.

The first gate insulating layer 112 disposed between the first semiconductor layer Act1 and the first gate electrode GE1 may include an inorganic insulating material, such as at least one compound selected from $SiO_2$, $SiN_x$, SiON, aluminum oxide ($Al_2O_3$), titanium oxide ($TiO_2$), tantalum oxide ($Ta_2O_5$), hafnium oxide ($HfM_2$), and zinc oxide (ZnO).

The second gate insulating layer 113 may be provided to cover the first gate electrode GE1. Like the first gate insulating layer 112, the second gate insulating layer 113 may include an inorganic insulating material, such as at least compound selected from $SiO_2$, $SiN_x$, SiON, $Al_2O_3$, $TiO_2$, $Ta_2O_5$, $HfO_2$, and ZnO.

An upper electrode CE2 of the storage capacitor Cst may be arranged on the second gate insulating layer 113 (e.g., disposed directly thereon in the Z direction). The upper electrode CE2 may overlap (e.g., in the Z direction) the first gate electrode GE1 thereunder. In this embodiment, the upper electrode CE2 and the first gate electrode GE1 of the driving thin-film transistor T1, which overlap each other with the second gate insulating layer 113 therebetween, may form the storage capacitor Cst. For example, the first gate electrode GE1 of the driving thin-film transistor T1 may function as a lower electrode CE1 of the storage capacitor Cst.

As such, the storage capacitor Cst and the driving thin-film transistor T1 may overlap each other. However, embodiments of the present inventive concepts are not limited thereto and the storage capacitor Cst may not overlap the driving thin-film transistor T1 in some embodiments.

In an embodiment, the upper electrode CE2 may include at least one compound selected from Al, platinum (Pt), palladium (Pd), silver (Ag), magnesium (Mg), gold (Au), nickel (Ni), neodymium (Nd), iridium (Ir), chrome (Cr), calcium (Ca), Mo, Ti, tungsten (W), and Cu, and may include a single layer or multi-layer including the above material.

An interlayer insulating layer 114 may cover the upper electrode CE2. In an embodiment, the interlayer insulating layer 114 may include at least one compound selected from $SiO_2$, $SiN_x$, SiON, $Al_2O_3$, $TiO_2$, $Ta_2O_5$, $HfO_2$, and ZnO. The interlayer insulating layer 114 may include a single layer or multi-layer including the inorganic insulating material described above.

The first drain electrode DE1 and the first source electrode SE1 may each be disposed on the interlayer insulating layer 114. The first drain electrode DE1 and the first source electrode SE1 may include a material having excellent conductivity. The first drain electrode DE1 and the first source electrode SE1 may include a conductive material including at least one compound selected from Mo, Al, Cu, and Ti, and may include a multi-layer or single layer including the above material. In an embodiment, the first drain electrode DE1 and the first source electrode SE1 may have a multi-layered structure of Ti/Al/Ti.

The switching thin-film transistor T2 may include a second semiconductor layer Act2, a second gate electrode GE2, a second drain electrode DE2, and a second source electrode SE2. The arrangement of the second semiconductor layer Act2, the second gate electrode GE2, the second drain electrode DE2, and the second source electrode SE2 are respectively similar to the first semiconductor layer Act1, the first gate electrode GE1, the first drain electrode DE1, and the first source electrode SE1, and thus, detailed descriptions thereof are omitted for convenience of explanation.

The first organic insulating layer 115 may be arranged to cover the first drain electrode DE1 and the first source electrode SEL. The first organic insulating layer 115 may include an organic material. For example, in an embodiment, the first organic insulating layer 115 may include an organic insulating material including a general-purpose polymer such as poly(methyl methacrylate) (PMMA) or polystyrene (PS), polymer derivatives having a phenol-based group, an acrylic polymer, an imide-based polymer, an aryl ether-based polymer, an amide-based polymer, a fluorine-based polymer, a p-xylene-based polymer, a vinyl alcohol-based polymer, and a blend thereof. However, embodiments of the present inventive concepts are not limited thereto.

A connection electrode CML may be arranged on the first organic insulating layer 115 (e.g., disposed directly thereon in the Z direction). In this embodiment, the connection electrode CML may be electrically connected to the first drain electrode DE1 or the first source electrode SE1 via a contact hole in the first organic insulating layer 115. The connection electrode CML may include a material having excellent conductivity. In an embodiment, the connection electrode CML may include a conductive material including at least one compound selected from Mo, Al, Cu, Ti, and the like and may include a single layer or multi-layer including the above material. For example, in an embodiment, the connection electrode CML may have a multi-layer structure of Ti/Al/Ti.

The second organic insulating layer 116 may be arranged to cover the connection electrode CML. The second organic insulating layer 116 may include an organic material. In an embodiment, the second organic insulating layer 116 may include an organic insulating material, such as a general-purpose polymer, for example, PMMA or PS, a polymer derivate having a phenol-based group, an acrylic polymer, an imide-based polymer, an aryl ether-based polymer, an amide-based polymer, a fluorine-based polymer, a p-xylene-based polymer, a vinyl alcohol-based polymer, and a blend thereof. However, embodiments of the present inventive concepts are not limited thereto.

The display element layer DEL may be arranged on the pixel circuit layer PCL (e.g., disposed directly thereon in the Z direction). The display element layer DEL may include a display element. In an embodiment, the display element layer DEL may include a plurality of display elements. A first organic light-emitting diode OLED1 may be arranged in the first display area DA1 as a first display element.

A pixel electrode 211 of the first organic light-emitting diode OLED1 may be electrically connected to the connection electrode CML via a contact hole in the second organic insulating layer 116. Accordingly, the first organic light-emitting diode OLED1 may be electrically connected to the first pixel circuit PC1.

In an embodiment, the pixel electrode 211 may include a conductive oxide such as at least one compound selected from indium tin oxide (ITO), indium zinc oxide (IZO), zinc oxide (ZnO), indium oxide ($In_2O_3$), indium gallium oxide (IGO), and aluminum zinc oxide (AZO). However, embodiments of the present inventive concepts are not limited thereto. For example, in an embodiment, the pixel electrode 211 may include a reflective layer including Ag, Mg, Al, Pt, Pd, Au, Ni, Nd, Ir, Cr, or a compound thereof. In an embodiment, the pixel electrode 211 may further include a layer including ITO, IZO, ZnO, or $In_2O_3$ on/under the reflective layer described above.

A pixel-defining layer 118 having an opening 118OP exposing a central portion of the pixel electrode 211 may be arranged on lateral ends of the pixel electrode 211 and an upper surface of the second organic insulating layer 116. The pixel-defining layer 118 may include an organic insulating material and/or an inorganic insulating material. The opening 118OP may define an emission area of light emitted from the first organic light-emitting diode OLED1. For example, a width of the opening 118OP may correspond to a width of the emission area.

A spacer 119 may be arranged on the pixel-defining layer 118 (e.g., disposed directly thereon in the Z direction). In a method of manufacturing the display panel 10 according to an embodiment, a mask sheet may be used. For example, in this embodiment, the mask sheet may enter the opening 118OP of the pixel-defining layer 118, or may come into close contact with the pixel-defining layer 118. The spacer 119 may prevent a portion of the substrate 100 and a multi-layer on the substrate 100 from being damaged or broken by the mask sheet when a deposition material is deposited on the substrate 100.

In an embodiment, the spacer 119 may include an organic material such as polyimide. However, embodiments of the present inventive concepts are not limited thereto. For example, in an embodiment, the spacer 119 may include an inorganic insulating material such as $SiN_X$ or $SiO_2$, or may include an organic insulating material and an inorganic insulating material.

In an embodiment, the spacer 119 may include a material different from that of the pixel-defining layer 118. However, embodiments of the present inventive concepts are not limited thereto. For example, the spacer 119 may include a same material as the pixel-defining layer 118. In this embodiment, the pixel-defining layer 118 and the spacer 119 may be formed together in a mask process using a halftone mask or the like.

An intermediate layer 212 may be arranged on the pixel-defining layer 118, the pixel electrode 211 and the spacer 119. The intermediate layer 212 may include an emission layer 212b arranged at the opening 118OP of the pixel-defining layer 118. The emission layer 212b may not extend to overlap an upper surface of the pixel-defining layer 118 or the spacer 119. In an embodiment, the emission layer 212b may include a polymer organic material or low-molecular weight organic material, which emits light having a certain color.

A first functional layer 212a and a second functional layer 212c may be respectively arranged under and on the emission layer 212b. The first functional layer 212a may include, for example, a hole transport layer (HTL) or may include an HTL and a hole injection layer (HIL). The second functional layer 212c is an element arranged on the emission layer 212b and may be optional. In an embodiment, the second functional layer 212c may include an electron transport layer (ETL) and/or an electron injection layer (EIL). Like an opposite electrode 213 to be described below, the first functional layer 212a and/or the second functional layer 212c may be a common layer formed to entirely cover the substrate 100.

The opposite electrode 213 may include a conductive material having a low work function. In an embodiment, the opposite electrode 213 may include a (semi-)transparent layer including Ag, Mg, Al, Pt, Pd, Au, Ni, Nd, Ir, Cr, lithium (Li), Ca, or an alloy thereof. However, embodiments of the present inventive concepts are not limited thereto. For example, in an embodiment, the opposite electrode 213 may further include a layer, such as ITO, IZO, ZnO, or $In_2O_3$, on the (semi-)transparent layer including the above material.

In an embodiment, a capping layer may be further arranged on the opposite electrode 213. The capping layer may include lithium fluoride (LiF), an inorganic material, and/or an organic material.

An encapsulation layer ENL may be arranged on the opposite electrode 213 (e.g., disposed directly thereon in the Z direction). In an embodiment, the encapsulation layer ENL may include at least one inorganic encapsulation layer and at least one organic encapsulation layer. According to an embodiment, FIG. 5 illustrates that the encapsulation layer ENL includes a first inorganic encapsulation layer 310, an organic encapsulation layer 320, and a second inorganic encapsulation layer 330, which are sequentially stacked (e.g., in the Z direction). However, embodiments of the present inventive concepts are not limited thereto.

In an embodiment, the first inorganic encapsulation layer 310 and the second inorganic encapsulation layer 330 may each include one or more inorganic materials selected from $Al_2O_3$, $TiO_2$, $Ta_2O_5$, $HfO_2$, ZnO, $SiO_2$, $SiN_X$, and SiON. The organic encapsulation layer 320 may include a polymer-based material. In an embodiment, the polymer-based material may include an acrylic resin, an epoxy-based resin, polyimide, and polyethylene. In an embodiment, the organic encapsulation layer 320 may include acrylate.

A touch electrode layer may be arranged on the encapsulation layer ENL. An optical functional layer may be arranged on the touch electrode layer. The touch electrode layer may obtain coordinate information corresponding to an external input, for example, a touch event. The optical functional layer may reduce the reflectance of light (e.g., external light) incident from the outside towards a display device, and/or increase the color purity of light emitted from the display device. In an embodiment, the optical functional layer may include a retarder and/or a polarizer. The phase retarder may be of a film type or a liquid crystal coating type, and may include a λ/2 phase retarder and/or a λ/4 phase retarder. The polarizer may also be of a film type or a liquid crystal coating type. The film-type polarizer may include a stretchable synthetic resin film, and the liquid crystal-type polarizer may include liquid crystals arranged in a predetermined arrangement. The phase retarder and the polarizer may further include a protective film. However, embodiments of the present inventive concepts are not limited thereto.

For example, in an embodiment, the optical functional layer may include a black matrix and color filters. The color filters may be arranged by taking into account colors of light respectively emitted from pixels of a display panel. In an embodiment, the color filters may each include a red, green, or blue pigment or dye. In an embodiment, the color filters may each further include quantum dots in addition to the pigment or dye. In an embodiment, some of the color filters may not include the pigment or dye and may include scattering particles such as titanium oxide.

In an embodiment, the optical functional layer may include a destructive interference structure. The destructive interference structure may include a first reflective layer and a second reflective layer that are located on different layers.

First reflected light and second reflected light, which are respectively reflected from the first reflective layer and the second reflective layer, may destructively interfere with each other. Thus, the reflectance of external light is reduced.

An adhesive member may be disposed between the touch electrode layer and the optical functional layer (e.g., in the Z direction). The adhesive member may be composed of any general adhesive known in the art without limitation. In an embodiment, the adhesive member may be a pressure sensitive adhesive (PSA).

Figure 6:
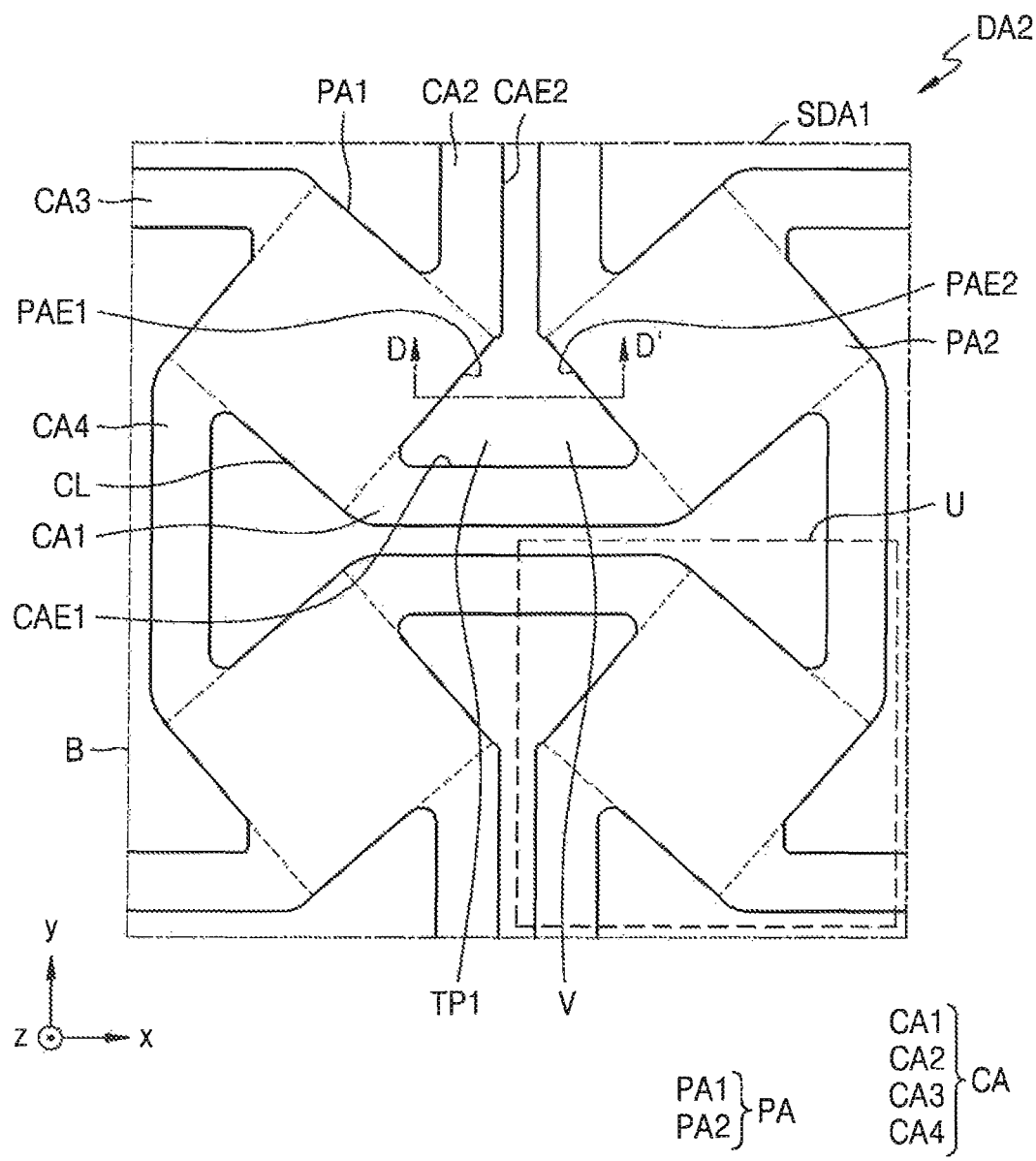
FIG. 6 is an enlarged view of display panel of area B of FIG. 3, according to an embodiment of the present inventive concepts.
Figure 7:
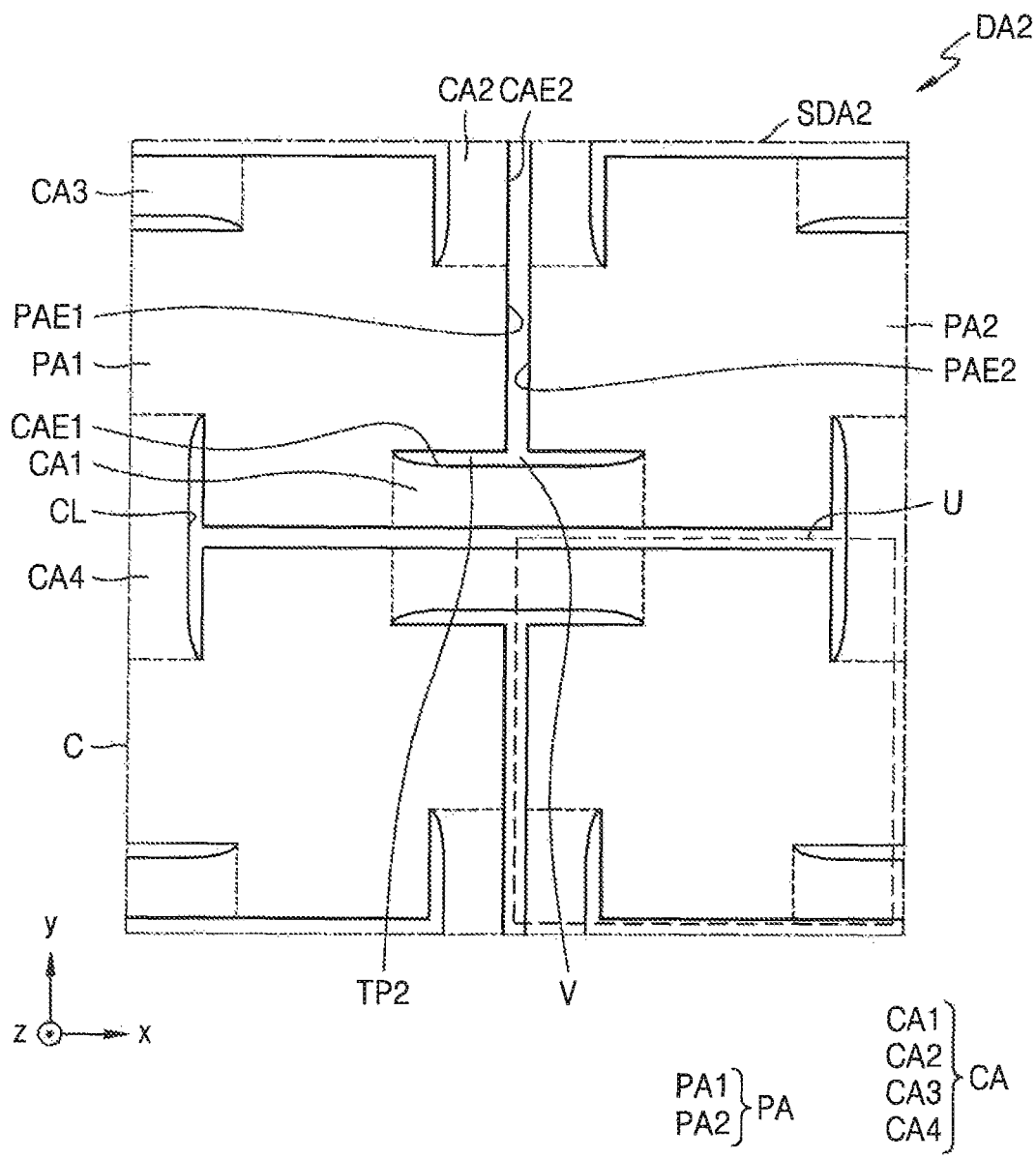
FIG. 7 is an enlarged view of a display panel of area C of FIG. 3, according to an embodiment of the present inventive concepts.

FIG. 6 is an enlarged view of an area B of the display panel in FIG. 3, according to an embodiment. FIG. 7 is an enlarged view of an area C of the display panel in FIG. 3, according to an embodiment.

Referring to the embodiments of FIGS. 6 and 7, the second display area DA2 may include a first pixel area PA1, a second pixel area PA2, and a connection area CA. Pixels may be arranged in each of the first pixel area PA1 and the second pixel area PA2. In an embodiment, the connection area CA may include a first connection area CA1, a second connection area CA2, a third connection area CA3, and a fourth connection area CA4. However, embodiments of the present inventive concepts are not limited thereto and the numbers of the pixel areas included in the plurality of pixel areas PA and connection areas included in the connection area CA may vary.

In an embodiment, the plurality of pixel areas PA may be spaced apart in the first direction (e.g., the X direction or the −X direction) and/or a second direction parallel to the y axis (hereinafter, the "Y direction"), such as the Y direction or the −Y direction. For example, the first pixel area PA1 and the second pixel area PA2 may be spaced apart in the first direction (e.g., the X direction or the −X direction) and/or the second direction (e.g., the Y direction or the −Y direction). Pixels may be arranged in each of the pixel areas PA.

Pixels may be arranged in the first pixel area PA1 and the second pixel area PA2. For example, a first pixel may overlap the first pixel area PA1. A second pixel may overlap the second pixel area PA2. In an embodiment, the first pixel and the second pixel may each include a red sub-pixel, a green sub-pixel, and a blue sub-pixel. However, embodiments of the present inventive concepts are not limited thereto and the colors of the sub-pixels for each pixel may vary. For example, in an embodiment, the first pixel and the second pixel may each include a red sub-pixel, a green sub-pixel, a blue sub-pixel, and a white sub-pixel.

The connection area CA may extend between adjacent pixel areas PA. In an embodiment, each of the pixel areas PA may be connected to four connection areas CA. For example, as shown in the embodiment of FIG. 6, the first pixel area PA1 may be connected to the first connection area CA1, the second connection area CA2, the third connection area CA3, and the fourth connection area CA4. In an embodiment, the four connection areas CA connected to one pixel area PA may extend in different directions, and each connection area CA may be connected to another respective pixel area PA arranged adjacent to the one pixel area PA. A wire for transmitting a signal and/or a power voltage to pixels arranged in the pixel area PA may be arranged in the connection area CA.

In an embodiment, the first connection area CA1 may extend from the first pixel area PA1 to the second pixel area PA2. For example, as shown in the embodiment of FIG. 6, the first connection area CA1 may extend longitudinally substantially in the X direction from the first pixel area PA1 to the second pixel area PA2. Accordingly, the first pixel area PA1 and the second pixel area PA2 may be connected by the first connection area CA1, and the first pixel area PA1, the second pixel area PA2, and the first connection area CA1 may be provided as one body.

A through portion may be defined or included in the second display area DA2. In an embodiment, a first through portion TP1 may be defined in the first sub-display area SDA1. A second through portion TP2 may be defined in the second sub-display area SDA2. The first pixel area PA1 and the second pixel area PA2 may be spaced apart with the through portion therebetween. The through portion may penetrate the display panel. For example, the through portion may entirely penetrate the display panel in a thickness direction of the display panel (e.g., the Z direction). Accordingly, the elements of the display panel may not be arranged in the through portion.

At least a partial portion of the through portion may be defined as an edge PAE1 of the first pixel area PA1, an edge PAE2 of the second pixel area PA2, and an edge of the connection area CA. For example, in an embodiment, at least a partial portion of the through portion may be defined as the edge PAE1 of the first pixel area PA1, the edge PAE2 of the second pixel area PA2, and an edge CAE1 of the first connection area CA1. In an embodiment, at least a portion of the through portion may be defined as the edge PAE1 of the first pixel area PA1, the edge PAE2 of the second pixel area PA2, the edge CAE1 of the first connection area CA1, and an edge CAE2 of the second connection area CA2.

A portion of one pixel area PA and connection areas CA extending therefrom may be defined as one basic unit U. In an embodiment, the basic unit U may be repeatedly arranged in the first direction (e.g., the X direction or the −X direction) and the second direction (e.g., the Y direction or the −Y direction), and the second display area DA2 may be understood as being provided as the repeatedly arranged basic units U that are connected to each other. In an embodiment, two adjacent basic units U may be symmetrical with each other. For example, in the embodiments of FIGS. 6 and 7, the two adjacent basic units U in the left and right directions (e.g., the X direction or −X direction) may be bilaterally symmetrical with respect to an axis of symmetry which is between the basic units U and is parallel to the second direction (e.g., the Y direction or the −Y direction). Similarly, in the embodiments of FIGS. 6 and 7, the two adjacent basic units U in the vertical direction (e.g., the Y direction or the −Y direction) may be vertically symmetrical with respect to an axis of symmetry which is between the basic units U and is parallel to the first direction (e.g., the X direction or the −X direction).

The basic units U adjacent to each other among the basic units U, for example, four basic units U shown in FIGS. 6 and 7, form a closed curve CL therebetween, and the closed curve CL may define a separated area V that is an empty space. The separated area V may be defined by the closed curve CL including the edges of the pixel areas PA and the edges of the connection areas CA. Each separated area V may penetrate upper and lower surfaces of each display panel. The separated area V may overlap the through portion of the display panel.

When an external force pulling the display panel 10 is applied, stress may concentrate on the edge CAE of the first connection area CA1 and the edge PAE2 of the second pixel area PA2. The closed curve CL defining the separated area V may include a curve for preventing damage to the display panel.

In an embodiment, the through portion may be provided in the second display area DA2. When the external force is applied in the first direction (e.g., the X direction or the −X direction) and/or the second direction (e.g., the Y direction or the −Y direction), the second display area DA2 may stretch in the first direction (e.g., the X direction or the −X direction) and/or the second direction (e.g., the Y direction or the −Y direction). Accordingly, the magnitude of stress generated in the second display area DA2 may be reduced, and cracks in the second display area DA2 may be prevented or reduced from occurring.

The through portion may include the first through portion TP1 overlapping the first sub-display area SDA1, and the second through portion TP2 overlapping the second sub-display area SDA2. In an embodiment, a size of the first through portion TP1 may be greater than a size of the second through portion TP2. The size of the first through portion TP1 may be defined as an area (e.g., area in a plan view taken from the X and Y directions) occupied by the first through portion TP1 in the first sub-display area SDA1. The size of the second through portion TP2 may be defined as an area (e.g., area in a plan view taken from the X and Y directions) occupied by the second through portion TP2 in the second sub-display area SDA2.

In the first state, the first sub-display area SDA1 may be rolled around the roller 20 (see FIG. 1A). In the first state, the second sub-display area SDA2 may not be rolled around the roller 20 and may extend away from the roller 20 (e.g., in the X direction). In this embodiment, the first sub-display area SDA1 may be rolled around the roller 20, and thus stress may be generated. Also, in the first state, a magnitude of stress generated in the first sub-display area SDA1 may be greater than a magnitude of stress generated in the second sub-display area SDA2.

In the present embodiment, the size of the first through portion TP1 provided in the first sub-display area SDA1 may be greater than the size of the second through portion TP2 provided in the second sub-display area SDA2. Accordingly, the first sub-display area SDA1 may be more stretchable than the second sub-display area SDA2, and stress generated in the first sub-display area SDA1 may be reduced. Therefore, in the present embodiment, even when the first sub-display area SDA1 is rolled around the roller 20 in the first state, the occurrence of cracks in the first sub-display area SDA1 may be reduced or prevented.

In an embodiment, the size of the through portion of the second display area DA2 may gradually decrease in a direction away from the first display area. However, embodiments of the present inventive concepts are not limited thereto and in some embodiments, the size of the through portion of the second display area DA2 may gradually increase in a direction away from the first display area.

In an embodiment, the size of the first through portion TP1 provided in the first sub-display area SDA1 may be equal to the size of the second through portion TP2 provided in the second sub-display area SDA2. In an embodiment, a shape of the first through portion TP1 may be the same as a shape of the second through portion TP2. For example, the shape of the first through portion TP1 and the shape of the second through portion TP2 may each be the shapes of the through portion described with reference to the embodiment of FIG. 6. However, embodiments of the present inventive concepts are not limited thereto. For example, in an embodiment, the shape of the first through portion TP1 and the shape of the second through portion TP2 may each be the shapes of the through portion described with reference to the embodiment of FIG. 7.

Figure 8:
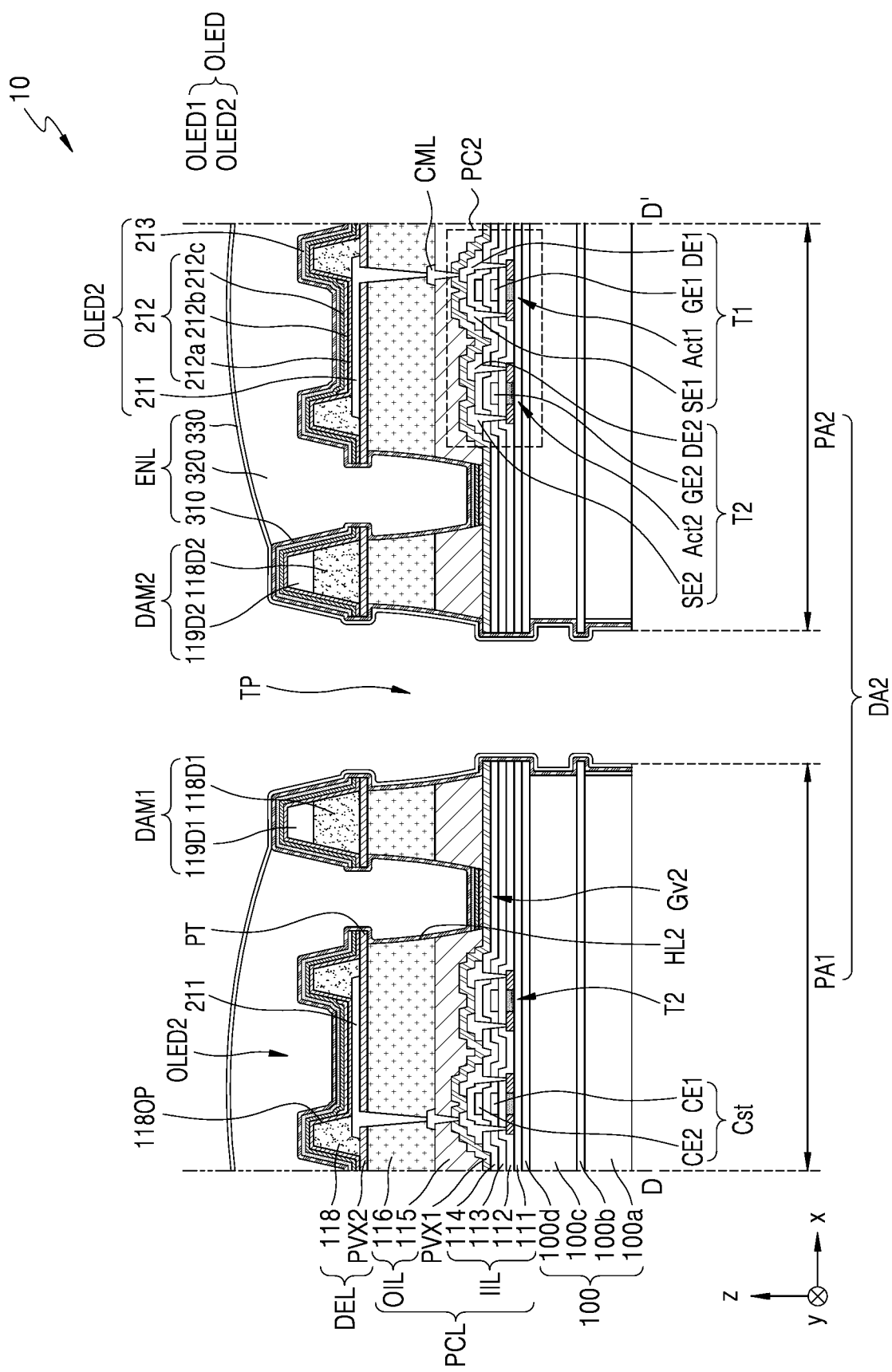
FIG. 8 is a cross-sectional view of a display panel, taken along line D-D' of FIG. 6, according to an embodiment of the present inventive concepts.

FIG. 8 is a cross-sectional view of a display panel 10, taken along a line D-D' of FIG. 6, according to an embodiment. In FIG. 8, the same reference numerals as those in FIG. 5 denote the same elements, and redundant descriptions thereof will be omitted for convenience of explanation.

Referring to the embodiment of FIG. 8, the display panel 10 may include the second display area DA2. The second display area DA2 may include the first pixel area PA1 and the second pixel area PA2 spaced apart from each other, and an edge of the first pixel area PA1 and an edge of the second pixel area PA2 may at least partially define a through portion TP of the display panel 10.

The display panel 10 may include the substrate 100, the pixel circuit layer PCL, the display element layer DEL, and the encapsulation layer ENL (e.g., arranged in the Z direction). In an embodiment, the pixel circuit layer PCL may further include a first inorganic layer PVX1. In an embodiment, the display element layer DEL may further include a second inorganic layer PVX2. However, embodiments of the present inventive concepts are not limited thereto. For example, in some embodiments, the first inorganic layer PVX1 may be omitted.

Hereinafter, a stacked structure of the display panel 10 including the through portion TP will be described in detail. However, the stacked structure of the display panel 10 including the through portion TP is not limited thereto, and various embodiments may be made.

As shown in the embodiment of FIG. 8, the substrate 100 may be separated into discrete parts in the second display area DA2 with the through portion TP therebetween. For example, the discrete parts of the substrate 100 may be spaced apart from each other (e.g., in the X direction) in the second display area DA2 with the through portion TP therebetween. In an embodiment, the substrate 100 may include the first base layer 100a, a first barrier layer 100b, the second base layer 100c, and the second barrier layer 100d (e.g., sequentially stacked in the Z direction).

The pixel circuit layer PCL may be arranged on the substrate 100 (e.g., directly thereon in the Z direction). The pixel circuit layer PCL may similarly be separated into discrete parts with the through portion TP therebetween. The pixel circuit layer PCL may include a pixel circuit. In an embodiment, the pixel circuit layer PCL may include a plurality of pixel circuits. A second pixel circuit PC2 among the pixel circuits may include the driving thin-film transistor T1, the switching thin-film transistor T2, and the storage capacitor Cst.

The pixel circuit layer PCL may include the inorganic insulating layer IIL and the organic insulating layer OIL under and/or above the elements of the driving thin-film transistor T1. The inorganic insulating layer IIL and the organic insulating layer OIL may be disposed between the substrate 100 and a second organic light-emitting diode OLED2 (e.g., in the Z direction).

The inorganic insulating layer IIL may be separated into discrete parts in the second display area DA2 with the through portion TP therebetween. As shown in the embodiment of FIG. 8, the inorganic insulating layer IIL may include the buffer layer 111, the first gate insulating layer 112, the second gate insulating layer 113, and the interlayer insulating layer 114. However, embodiments of the present inventive concepts are not limited thereto.

The organic insulating layer OIL may include a second display area hole HL2 in the second display area DA2. The second display area hole HL2 may be disposed between the second organic light-emitting diode OLED2 and the through portion TP (e.g., in the X direction). In an embodiment, the second display area hole HL2 may penetrate the organic insulating layer OIL. For example, as shown in the embodiment of FIG. 8, the second display area hole HL2 may penetrate the entire thickness (e.g., length in the Z direction) of the organic insulating layer OIL.

In an embodiment, the second display area hole HL2 may be provided as a hole of the first organic insulating layer 115 and a hole of the second organic insulating layer 116. However, embodiments of the present inventive concepts are not limited thereto. For example, in an embodiment, the second display area hole HL2 may be provided in the the second organic insulating layer 116. In this embodiment, an upper surface of the first organic insulating layer 115 may be exposed by the second display area hole HL2 of the second organic insulating layer 116. Hereinafter, an embodiment in which the second display area hole HL2 is provided in both the first organic insulating layer 115 and the second organic insulating layer 116 will be mainly described in detail for convenience of explanation.

In an embodiment, the organic insulating layer OIL may include a groove in a thickness direction of the organic insulating layer OIL in the second display area DA2 instead of the second display area hole HL2.

In an embodiment, the first inorganic layer PVX1 may be disposed between the interlayer insulating layer 114 and the first organic insulating layer 115 (e.g., in the Z direction). The first inorganic layer PVX1 may cover (e.g., directly cover) the first source electrode SE1, the first drain electrode DE1, the second source electrode SE2, and the second drain electrode DE2. As shown in the embodiment of FIG. 8, the first inorganic layer PVX1 may include a contact hole so that the first source electrode SE1 or the first drain electrode DE1 is electrically connected to the connection electrode CML. However, embodiments of the present inventive concepts are not limited thereto.

For example, in an embodiment, the first inorganic layer PVX1 may be disposed between the first organic insulating layer 115 and the second organic insulating layer 116 (e.g., in the Z direction). In this embodiment, the first inorganic layer PVX1 may cover (e.g., directly cover) the connection electrode CML.

At least a partial portion of the first inorganic layer PVX1 may be exposed by the second display area hole HL2. In an embodiment, the first inorganic layer PVX1 may include a single layer or multi-layer including an inorganic material, such as $SiN_X$ and/or $SiO_2$. However, embodiments of the present inventive concepts are not limited thereto. For example, in an embodiment, the first inorganic layer PVX1 may be omitted.

The display element layer DEL may be arranged on the pixel circuit layer PCL (e.g., disposed directly thereon in the Z direction). The display element layer DEL may include the second organic light-emitting diode OLED2 as a second display element. In an embodiment, the second organic light-emitting diode OLED2 may be provided as a plurality of second organic light-emitting diodes OLED2 on the second display area DA2. The second organic light-emitting diodes OLED2 may be arranged in the first pixel area PA1 and the second pixel area PA2. The second organic light-emitting diodes OLED2 of the first pixel area PA1 and the second pixel area PA2 may be spaced apart from each other with the through portion TP therebetween.

The second organic light-emitting diode OLED2 may include the pixel electrode 211, the intermediate layer 212, and the opposite electrode 213. The second organic light-emitting diode OLED2 may be electrically connected to the second pixel circuit PC2.

The second inorganic layer PVX2 may be disposed between the second organic light-emitting diode OLED2 and the second organic insulating layer 116 (e.g., in the Z direction). For example, the second organic light-emitting diode OLED2 may be arranged on the second inorganic layer PVX2. In an embodiment, the second inorganic layer PVX2 may include a plurality of inorganic patterns that are spaced apart from each other on the second organic insulating layer 116. The second inorganic layer PVX2 may include a protruding tip PT that protrudes towards a center of the second display area hole HL2. Accordingly, a lower surface of the protruding tip PT may be exposed at the second display area hole HL2. For example, the second display area hole HL2 may have an undercut structure. In an embodiment, the second inorganic layer PVX2 may include a single layer or multi-layer including an inorganic material, such as $SiN_X$ and/or $SiO_2$. However, embodiments of the present inventive concepts are not limited thereto.

In an embodiment, the first inorganic layer PVX1, the second display area hole HL2, and the second inorganic layer PVX2 may define a second groove Gv2 in the second display area DA2. However, embodiments of the present inventive concepts are not limited thereto. For example, in an embodiment in which the organic insulating layer OIL includes a groove, the groove and the second inorganic layer PVX2 may define the second groove Gv2 in the second display area DA2.

The second display area hole HL2 and the protruding tip PT of the second inorganic layer PVX2 may be a structure for disconnecting the first functional layer 212a and the second functional layer 212c. In an embodiment, the first functional layer 212a, the second functional layer 212c, and the opposite electrode 213 may be formed on an entire surface of the substrate 100. In this embodiment, the first functional layer 212a and the second functional layer 212c may include an organic material, and external oxygen, moisture, or the like may be introduced from the through portion TP to the second organic light-emitting diodes OLED2 through at least one of the first functional layer 212a and the second functional layer 212c. Such oxygen or moisture may damage the second organic light-emitting diode OLED2. In an embodiment, the second display area hole HL2 and the protruding tip PT of the second inorganic layer PVX2 may disconnect the first functional layer 212a and the second functional layer 212c, and a first functional layer pattern and a second functional layer pattern, which are separated from each other, may be arranged inside the second display area hole HL2. Accordingly, the introduction of the moisture or oxygen from the through portion TP to the second organic light-emitting diode OLED2 may be prevented, and damage to the second organic light-emitting diode OLED2 may be prevented or reduced. However, the structure that disconnects the first functional layer 212a and the second functional layer 212c is not limited thereto, and various structures that disconnect the first functional layer 212a and the second functional layer 212c may be applied to the display panel 10.

A first dam portion DAM1 and a second dam portion DAM2 may be arranged on the second inorganic layer PVX2 (e.g., directly thereon in the Z direction). The first dam portion DAM1 and the second dam portion DAM2 may protrude in a thickness direction of the substrate 100 (e.g., the Z direction) from the second inorganic layer PVX2. The first dam portion DAM1 and the second dam portion DAM2 may be arranged adjacent to the through portion TP.

The first dam portion DAM1 may be arranged on the first pixel area PA1. In an embodiment, the first dam portion DAM1 may surround the second organic light-emitting diode OLED2 arranged in the first pixel area PA1. The first dam portion DAM1 may be arranged closer to the through portion TP than the second display area hole HL2. The first dam portion DAM1 may include a first pattern layer 118D1 and a first upper pattern layer 119D1. According to an embodiment, the first pattern layer 118D1 may include a same material as the pixel-defining layer 118. In an embodiment, the first upper pattern layer 119D1 may include an organic insulating material and/or an inorganic insulating material.

The second dam portion DAM2 may be arranged on the second pixel area PA2. In an embodiment, the second dam portion DAM2 may surround the second organic light-emitting diode OLED2 arranged in the second pixel area PA2. The second dam portion DAM2 may be arranged closer to the through portion TP than the second display area hole HL2. The second dam portion DAM2 may include a second pattern layer 118D2 and a second upper pattern layer 119D2. In an embodiment, the second pattern layer 118D2 may include a same material as the pixel-defining layer 118 and the first pattern layer 118D1. For example, in an embodiment, the pixel-defining layer 118, the first pattern layer 118D1, and the second pattern layer 118D2 may be simultaneously formed. The second upper pattern layer 119D2 may include an organic insulating material and/or an inorganic insulating material. For example, the second upper pattern layer 119D2 may include a same material as the first upper pattern layer 119D1. The first upper pattern layer 119D1 and the second upper pattern layer 119D2 may be simultaneously formed.

The encapsulation layer ENL may cover the second organic light-emitting diode OLED2. The encapsulation layer ENL may be arranged on the opposite electrode 213 (e.g., disposed directly thereon in the Z direction). The encapsulation layer ENL may be separated into discrete parts with the through portion TP therebetween. In an embodiment, the encapsulation layer ENL may include at least one inorganic encapsulation layer and at least one organic encapsulation layer. For example, as shown in the embodiment of FIG. 8, the encapsulation layer ENL includes the first inorganic encapsulation layer 310, the organic encapsulation layer 320, and the second inorganic encapsulation layer 330, which are sequentially stacked (e.g., in the Z direction).

The first inorganic encapsulation layer 310 may cover the second organic light-emitting diode OLED2. The first inorganic encapsulation layer 310 may entirely and continuously cover the substrate 100. For example, the first inorganic encapsulation layer 310 may cover the second organic light-emitting diodes OLED2, the second display area hole HL2, the first dam portion DAM1, and the second dam portion DAM2. The first inorganic encapsulation layer 310 may directly contact the protruding tip PT of the second inorganic layer PVX2. The first inorganic encapsulation layer 310 may also directly contact the first inorganic layer PVX1. Accordingly, moisture or oxygen may be prevented from being introduced from the through portion TP to the second organic light-emitting diode OLED2 through a layer including an organic material. Also, the first inorganic encapsulation layer 310 may be separated based on the through portion TP.

The organic encapsulation layer 320 may be arranged on the first inorganic encapsulation layer 310 (e.g., disposed directly thereon in the Z direction). The organic encapsulation layer 320 may overlap the second organic light-emitting diode OLED2, and the organic encapsulation layer 320 may fill the second display area hole HL2. According to an embodiment, the organic encapsulation layer 320 may be separated based on the through portion TP. For example, the organic encapsulation layer 320 overlapping the second organic light-emitting diode OLED2 arranged in the first pixel area PA1 may extend to the first dam portion DAM1. The organic encapsulation layer 320 overlapping the second organic light-emitting diode OLED2 arranged in the second pixel area PA2 may extend to the second dam portion DAM2. Since the first dam portion DAM1 and the second dam portion DAM2 protrude in the thickness direction of the substrate 100 from an upper surface of the second inorganic layer PVX2, a flow of the material of the organic encapsulation layer 320 may be controlled thereby.

The second inorganic encapsulation layer 330 may cover the organic encapsulation layer 320. The second inorganic encapsulation layer 330 may entirely and continuously cover the substrate 100. The second inorganic encapsulation layer 330 may directly contact the first inorganic encapsulation layer 310 on the first dam portion DAM1 and the second dam portion DAM2. Accordingly, the organic encapsulation layer 320 may be separated by the first dam portion DAM1 and the second dam portion DAM2 and may not extend into the through portion TP therebetween. The second inorganic encapsulation layer 330 may be separated based on the through portion TP.

In an embodiment of the present inventive concepts, the second display area DA2 may include the first pixel area PA1 and the second pixel area PA2, which are separated from each other. In this embodiment, even if a crack occurs in any one of the first pixel area PA1 and the second pixel area PA2, the spread of the cracks to the other of the first pixel area PA1 and the second pixel area PA2 may be prevented or reduced. Accordingly, the display panel may have an increased reliability.

Figure 9:
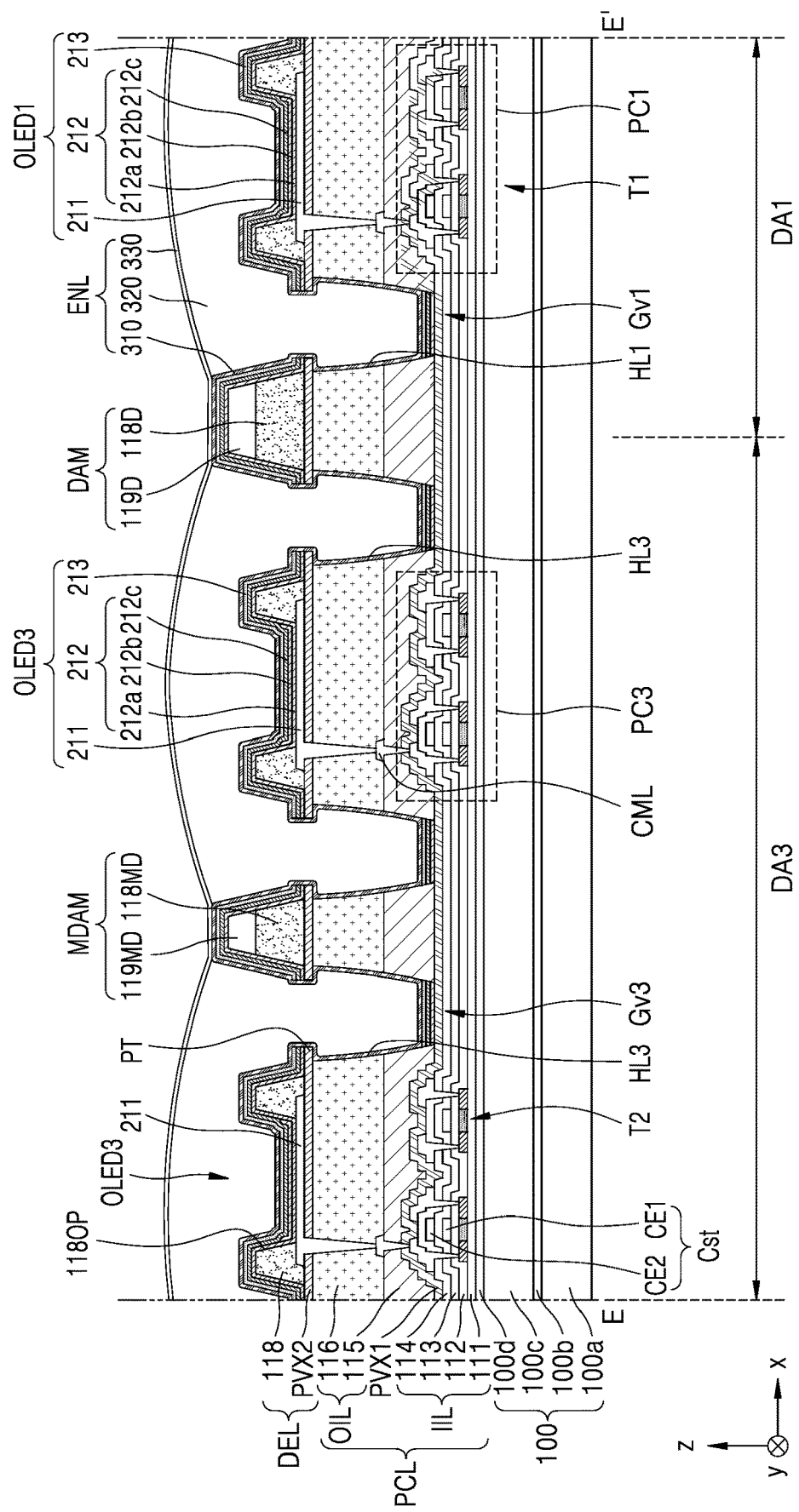
FIG. 9 is a cross-sectional view of a display panel, taken along line E-E' of FIG. 3, according to an embodiment of the present inventive concepts.

FIG. 9 is a cross-sectional view of a display panel, taken along a line E-E' of FIG. 3, according to an embodiment. In FIG. 9, the same reference numerals as those in FIG. 5 denote the same elements, and redundant descriptions thereof will be omitted for convenience of explanation.

Referring to the embodiment of FIG. 9, the display panel may include the first display area DA1, a second display area DA2 (FIG. 3), and the third display area DA3. The third display area DA3 may be disposed between the first display area DA1 and the second display area. In an embodiment, the first display area DA1 and the third display area DA3 may not include a through portion.

The display panel 10 may include the substrate 100, the pixel circuit layer PCL, the display element layer DEL, and the encapsulation layer ENL. In an embodiment, the pixel circuit layer PCL may further include the first inorganic layer PVX1. In an embodiment, the display element layer DEL may further include the second inorganic layer PVX2.

The substrate 100 may extend from the first display area DA1 to the third display area DA3. For example, in an embodiment, the substrate 100 may be continuously arranged in the first display area DA1 and the third display area DA3. In an embodiment, the substrate 100 may include the first base layer 100a, a first barrier layer 100b, the second base layer 100c, and the second barrier layer 100d (e.g., consecutively stacked in the Z direction).

The pixel circuit layer PCL may include a pixel circuit. In an embodiment, the pixel circuit layer PCL may include a plurality of pixel circuits. The first pixel circuit PC1 and a third pixel circuit PC3 among the pixel circuits may each include a driving thin-film transistor T1, a switching thin-film transistor T2, and a storage capacitor Cst.

The pixel circuit layer PCL may include the inorganic insulating layer IIL and the organic insulating layer OIL under and/or above the elements of the driving thin-film transistor T1.

The inorganic insulating layer IIL may extend from the first display area DA1 to the third display area DA3. For example, in an embodiment, the inorganic insulating layer IIL may be continuously arranged in the first display area DA1 and the third display area DA3.

The organic insulating layer OIL may include at least one third display area hole HL3 in the third display area DA3. The third display area hole HL3 may overlap the third display area DA3. In an embodiment, the organic insulating layer OIL may include a first display area hole HL1 in the first display area DA1 adjacent to the third display area DA3.

In an embodiment, the third display area hole HL3 may be provided as third display area holes HL3 in the third display area DA3, similar to the second display area hole. Accordingly, the third display area DA3 may prevent or reduce a boundary between the first display area DA1 and the second display area DA2 (FIG. 3) from being visually recognized.

The display element layer DEL may be arranged on the pixel circuit layer PCL (e.g., disposed directly thereon in the Z direction). The display element layer DEL may include a plurality of display elements. As shown in the embodiment of FIG. 9, the display elements may include the first organic light-emitting diode OLED1 as a first display element arranged in the first display area DA1, and a third organic light-emitting diode OLED3 as a third display element arranged in the third display area DA3.

The first organic light-emitting diode OLED1 and the third organic light-emitting diode OLED3 may each include a pixel electrode 211, an intermediate layer 212, and an opposite electrode 213. The first organic light-emitting diode OLED1 and the third organic light-emitting diode OLED3 may be electrically connected to the first pixel circuit PC1 and the third pixel circuit PC3, respectively.

The first organic light-emitting diode OLED1 may be arranged on the second organic insulating layer 116. In an embodiment, the second inorganic layer PVX2 may be disposed between the second organic insulating layer 116 and a first organic light-emitting diode OLED1 (e.g., in the Z direction) arranged adjacent to the third display area DA3 among a plurality of first organic light-emitting diodes OLED1. For example, the second inorganic layer PVX2 may be disposed between the second organic insulating layer 116 and a first organic light-emitting diode OLED1 facing the third display area DA3 among the first organic light-emitting diodes OLED1.

The third organic light-emitting diode OLED3 may be arranged in the third display area DA3. The second inorganic layer PVX2 may be disposed between the third organic light-emitting diode OLED3 and the second organic insulating layer 116 (e.g., in the Z direction). For example, the third organic light-emitting diode OLED3 may be arranged on the second inorganic layer PVX2 (e.g., disposed directly thereon in the Z direction). The second inorganic layer PVX2 may include a plurality of inorganic patterns that are spaced apart from each other on the second organic insulating layer 116. The second inorganic layer PVX2 may include a protruding tip PT that protrudes towards a center of the third display area hole HL3. Accordingly, a lower surface of the protruding tip PT may be exposed at the third display area hole HL3. For example, the third display area hole HL3 may have an undercut structure.

In an embodiment, the first inorganic layer PVX1, the third display area hole HL3, and the second inorganic layer PVX2 may define a third groove Gv3 in the third display area DA3. The first inorganic layer PVX1, the first display area hole HL1, and the second inorganic layer PVX2 may define a first groove Gv1 in the first display area DAL.

However, embodiments of the present inventive concepts are not limited thereto. For example, in an embodiment in which the organic insulating layer OIL includes a groove instead of the third display area hole HL3, the groove and the second inorganic layer PVX2 may define the third groove Gv3 in the third display area DA3. Also, when the organic insulating layer OIL includes a groove instead of the first display area hole HL1, the groove and the second inorganic layer PVX2 may define the first groove Gv1 in the first display area DA1.

A dam portion DAM may be arranged on the second inorganic layer PVX2 (e.g., disposed directly thereon in the Z direction). The dam portion DAM may protrude in the thickness direction of the substrate 100 (e.g., the Z direction). The dam portion DAM may define a boundary between the first display area DA1 and the third display area DA3. For example, the dam portion DAM may be disposed between the first organic light-emitting diode OLED1 and the third organic light-emitting diode OLED3 (e.g., in the X direction). In an embodiment, the dam portion DAM may be disposed between the first organic light-emitting diode OLED1 and any one of a plurality of third organic light-emitting diodes OLED3 facing the first organic light-emitting diode OLED1.

The dam portion DAM may include a pattern layer 118D and an upper pattern layer 119D. In this embodiment, the pattern layer 118D and/or the upper pattern layer 119D may be disposed between the first organic light-emitting diode OLED1 and the third organic light-emitting diode OLED3. In an embodiment, the pattern layer 118D may include a same material as the pixel-defining layer 118. The upper pattern layer 119D may include an organic insulating material and/or an inorganic insulating material.

As shown in the embodiment of FIG. 9, an intermediate dam portion MDAM may be arranged on the second inorganic layer PVX2 (e.g., disposed directly thereon in the Z direction). The intermediate dam portion MDAM may protrude in the thickness direction of the substrate 100 (e.g., the Z direction). The intermediate dam portion MDAM may be arranged on the third display area DA3. The intermediate dam portion MDAM may be disposed between a plurality of adjacent third organic light-emitting diodes OLED3 (e.g., in the X direction).

The intermediate dam portion MDAM may include an intermediate pattern layer 118MD and an upper intermediate pattern layer 119MD. In this embodiment, the intermediate pattern layer 118MD and/or the upper intermediate pattern layer 119MD may be disposed between the adjacent third organic light-emitting diodes OLED3. In an embodiment, the intermediate pattern layer 118MD may include a same material as the pixel-defining layer 118. The upper intermediate pattern layer 119MD may include an organic insulating material and/or an inorganic insulating material.

The encapsulation layer ENL may be arranged on the display elements. In an embodiment, the encapsulation layer ENL may be arranged on the first organic light-emitting diode OLED1 and the third organic light-emitting diode OLED3. In an embodiment, the encapsulation layer ENL may include at least one inorganic encapsulation layer and at least one organic encapsulation layer. For example, as shown in the embodiment of FIG. 9, the encapsulation layer ENL may include a first inorganic encapsulation layer 310, an organic encapsulation layer 320 and a second inorganic encapsulation layer 330. However, embodiments of the present inventive concepts are not limited thereto.

The first inorganic encapsulation layer 310 may cover the first organic light-emitting diode OLED1 and the third organic light-emitting diode OLED3. In an embodiment, the first inorganic encapsulation layer 310 may entirely and continuously cover the substrate 100. For example, the first inorganic encapsulation layer 310 may cover the first organic light-emitting diode OLED1, the first display area hole HL1, the dam portion DAM, the third display area hole HL3, the third organic light-emitting diodes OLED3, and the intermediate dam portion MDAM. The first inorganic encapsulation layer 310 may directly contact the protruding tip PT of the second inorganic layer PVX2. The first inorganic encapsulation layer 310 may directly contact the first inorganic layer PVX1. Accordingly, the introduction of moisture or oxygen to the first organic light-emitting diode OLED1 and/or the third organic light-emitting diode OLED3 through a layer including an organic material may be prevented or reduced.

The organic encapsulation layer 320 may be arranged on the first inorganic encapsulation layer 310 (e.g., disposed directly thereon in the Z direction). The organic encapsulation layer 320 may overlap the first organic light-emitting diode OLED1 and the second organic light-emitting diode OLED2, and the organic encapsulation layer 320 may fill the first display area hole HL1 and the third display area hole HL3.

The organic encapsulation layer 320 may be separated due to the dam portion DAM. For example, the organic encapsulation layer 320 that overlaps the first organic light-emitting diode OLED1 may extend to the dam portion DAM. The organic encapsulation layer 320 overlapping the third organic light-emitting diode OLED3 may extend to the dam portion DAM. Since the dam portion DAM protrudes in the thickness of the substrate 100 from the upper surface of the second inorganic layer PVX2, a flow of the material of the organic encapsulation layer 320 may be controlled.

In an embodiment, the organic encapsulation layer 320 may also be separated due to the intermediate dam portion MDAM. In this embodiment, the organic encapsulation layer 320 arranged in the third display area DA3 may be separated due to the intermediate dam portion MDAM. However, embodiments of the present inventive concepts are not limited thereto. For example, in an embodiment, the organic encapsulation layer 320 may not be separated based on the intermediate dam portion MDAM.

The second inorganic encapsulation layer 330 may cover the organic encapsulation layer 320. In an embodiment, the second inorganic encapsulation layer 330 may entirely and continuously cover the substrate 100. The second inorganic encapsulation layer 330 may directly contact the first inorganic encapsulation layer 310 on the dam portion DAM. Accordingly, the organic encapsulation layer 320 may be separated by the dam portion DAM.

In the embodiment shown in FIG. 9, the third display area DA3 may include the third display area hole HL3 and the intermediate dam portion MDAM disposed between the third organic light-emitting diodes OLED3, similar to the second display area DA2 (see FIG. 7). The third display area DA3 may not include a through portion TP unlike the second display area DA2. Since the third display area DA3 may be disposed between the first display area DA1 and the second display area DA2, the boundary between the first display area DA1 and the second display area DA2 may be prevented or reduced from being visually recognized. For example, the third display area DA3 may be an area providing a gradual resolution change from the first display area DA1 to the second display area DA2.

Figure 10:
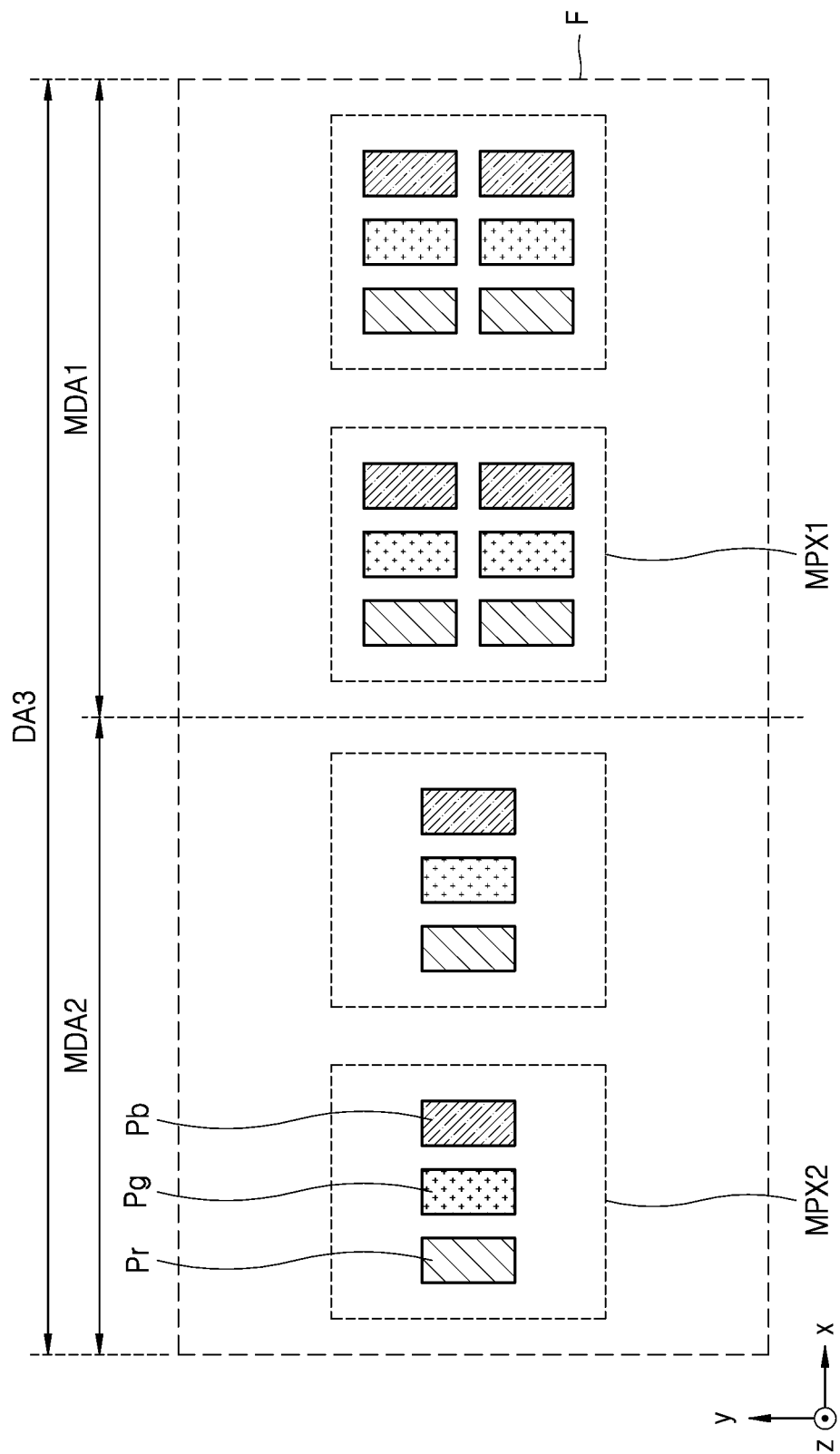
FIG. 10 is an enlarged view of a display panel of area F of FIG. 3, according to an embodiment of the present inventive concepts.

FIG. 10 is an enlarged view of an area F of the display panel in FIG. 3, according to an embodiment.

Referring to the embodiment of FIG. 10, the third display area DA3 may include a first intermediate display area MDA1 and a second intermediate display area MDA2. In an embodiment, the first intermediate display area MDA1 may be arranged closer to a first display area (FIG. 3) than the second intermediate display area MDA2.

In an embodiment, a plurality of first intermediate pixels MPX1 may be arranged in the first intermediate display area MDA1. A plurality of second intermediate pixels MPX2 may be arranged in the second intermediate display area MDA2. The plurality of first intermediate pixels MPX1 may be distinguished by the intermediate dam portion MDAM and the third display area hole HL3 described with reference to the embodiment of FIG. 9. The plurality of second intermediate pixels MPX2 may be distinguished by the intermediate dam portion MDAM and the third display area hole HL3 described with reference to the embodiment of FIG. 9.

As shown in the embodiment of FIG. 10, the first intermediate pixels MPX1 and the second intermediate pixels MPX2 may each include a red sub-pixel Pr, a green sub-pixel Pg, and a blue sub-pixel Pb. However, embodiments of the present inventive concepts are not limited thereto and the colors of the sub-pixels may vary. For example, in an embodiment, at least one of the first intermediate pixels MPX1 and the second intermediate pixels MPX2 may include a red sub-pixel Pr, a green sub-pixel Pg, a blue sub-pixel Pb, and a white sub-pixel. A sub-pixel such as the red sub-pixel Pr, the green sub-pixel Pg, the blue sub-pixel Pb, and a white sub-pixel may be implemented by a display element. For example, the sub-pixel may be implemented by a third organic light-emitting diode as a third display element arranged in the third display area DA3.

In an embodiment, a density of sub-pixels arranged in the first intermediate display area MDA1 may be greater than a density of sub-pixels arranged in the second intermediate display area MDA2. For example, a number of sub-pixels included in the first intermediate pixels MPX1 per a unit area may be greater than a number of sub-pixels included in the second intermediate pixels MPX2 per the unit area. For example, as shown in the embodiment of FIG. 10, the first intermediate pixels MPX1 may include two red sub-pixels Pr, two green sub-pixels Pg, and two blue sub-pixels Pb. The second intermediate pixels MPX2 may include one red sub-pixel Pr, one green sub-pixel Pg, and one blue sub-pixel Pb. However, embodiments of the present inventive concepts are not limited thereto and the numbers of the sub-pixels included in the first intermediate pixels MPX1 and the second intermediate pixels MPX2 may vary. In an embodiment, a density of sub-pixels arranged in the first display area DA1 (FIG. 3) may be greater than or equal to the density of the sub-pixels arranged in the first intermediate display area MDA1. A density of sub-pixels arranged in the second display area may be less than or equal to the density of the sub-pixels arranged in the second intermediate display area MDA2.

For example, a density of third organic light-emitting diodes arranged in the first intermediate display area MDA1 may be greater than a density of third organic light-emitting diodes arranged in the second intermediate display area MDA2. In an embodiment, a number of third organic light-emitting diodes included in the first intermediate pixel MPX1 may be greater than a number of third organic light-emitting diodes included in the second intermediate pixel MPX2. In an embodiment, a density of first organic light-emitting diodes arranged in the first display area may be greater than or equal to the density of the third organic light-emitting diodes arranged in the first intermediate display area MDA1. A density of second organic light-emitting diodes arranged in the second display area may be less than or equal to the density of the third organic light-emitting diodes arranged in the second intermediate display area MDA2.

In the embodiment shown in FIG. 10, a resolution of the first intermediate display area MDA1 may be higher than a resolution of the second intermediate display area MDA2. A resolution of the first display area DA1 may be higher than or equal to the resolution of the first intermediate display area MDA1. A resolution of the second display area may be lower than or equal to the resolution of the second intermediate display area MDA2. In this embodiment, the third display area DA3 may gradually reduce the resolution difference between the first display area DA1 and the second display area DA2. Accordingly, a boundary between the first display area and the second display area may be prevented from being visually recognized.

Figure 11:
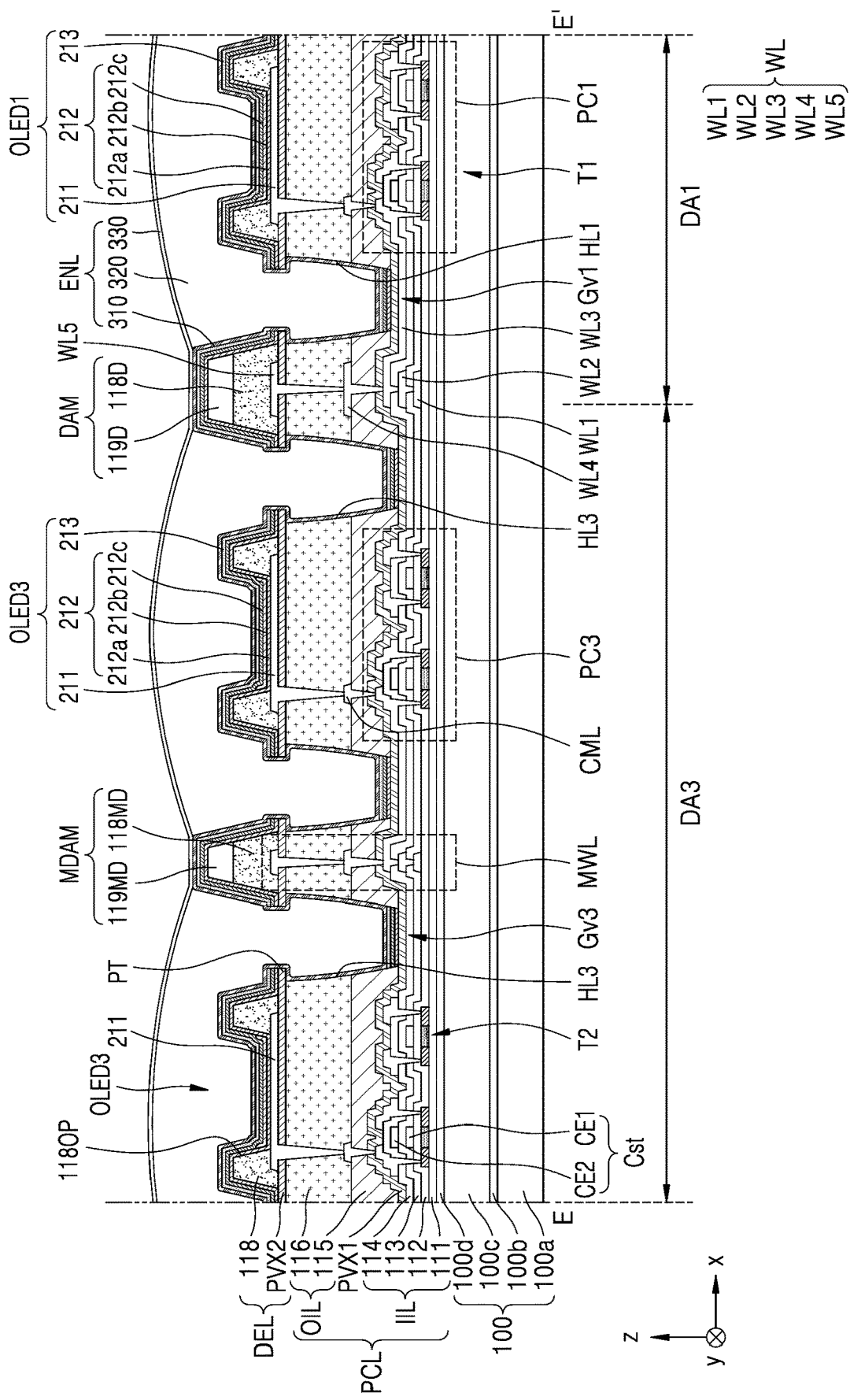
FIG. 11 is a cross-sectional view of a display panel, taken along line E-E' of FIG. 3, according to an embodiment of the present inventive concepts.

FIG. 11 is a cross-sectional view of a display panel, taken along a line E-E' of FIG. 3, according to an embodiment. In FIG. 11, the same reference numerals as those in FIG. 9 denote the same elements, and redundant descriptions thereof will be omitted for convenience of explanation.

Referring to the embodiment of FIG. 11, a wire WL may be disposed between the substrate 100 and the pattern layer 118D of the dam portion DAM. The wire WL may be configured to transmit a power voltage and/or a signal to the pixel circuit PC. The wire WL may overlap the dam portion DAM.

The wire WL may be electrically connected to a pixel circuit that is electrically connected to any one of a plurality of display elements. In an embodiment, the wire WL may be electrically connected to at least one of the first pixel circuit PC1 and the third pixel circuit PC3. In an embodiment, the wire WL may also be electrically connected to the second pixel circuit PC2.

As shown in the embodiment of FIG. 11, the wire WL may include a first wire WL1, a second wire WL2, a third wire WL3, a fourth wire WL4, and a fifth wire WL5. However, embodiments of the present inventive concepts are not limited thereto and the number of wire portions of the wire WL may vary. For example, in some embodiments, at least one of the first wire WL1, the second wire WL2, the third wire WL3, the fourth wire WL4, and the fifth wire WL5 may be omitted.

The first wire WL1 may be disposed between the first gate insulating layer 112 and the second gate insulating layer 113 (e.g., in the Z direction). In an embodiment, the first wire WL1 may include a conductive material including Mo, Al, Cu, Ti, and the like and may include a single layer or multi-layer including the above material.

The second wire WL2 may be disposed between the second gate insulating layer 113 and the interlayer insulating layer 114 (e.g., in the Z direction). The second wire WL2 may be electrically connected to the first wire WL1 through a contact hole in the second gate insulating layer 113. In an embodiment, the second wire WL2 may include Al, Pt, Pd, Ag, Mg, Au, Ni, Nd, Ir, Cr, Ca, Mo, Ti, W, and/or Cu, and may include a single layer or multi-layer including the above material.

The third wire WL3 may be disposed between the interlayer insulating layer 114 and the first organic insulating layer 115 (e.g., in the Z direction). The third wire WL3 may be electrically connected to the second wire WL2 through a contact hole in the interlayer insulating layer 114. In an embodiment, the third wire WL3 may extend toward the first pixel circuit PC1 and may be electrically connected to the first pixel circuit PC1.

In an embodiment, the third wire WL3 may be covered by (e.g., directly covered by) the first inorganic layer PVX1. In an embodiment, the third wire WL3 may include a conductive material including Mo, Al, Cu, Ti, and the like and may include a single layer or multi-layer including the above material. In an embodiment, the third wire WL3 may have a multi-layered structure of Ti/Al/Ti.

The fourth wire WL4 may be disposed between the first organic insulating layer 115 and the second organic insulating layer 116 (e.g., in the Z direction). The fourth wire WL4 may be electrically connected to the third wire WL3 through a contact hole in the first organic insulating layer 115 and/or a contact hole in the first inorganic layer PVX1. In an embodiment, the fourth wire WL4 may include a conductive material including Mo, Al, Cu, Ti, and the like and may include a single layer or multi-layer including the above material. For example, in an embodiment, the fourth wire WL4 may have a multi-layered structure of Ti/Al/Ti.

The fifth wire WL5 may be disposed between the second organic insulating layer 116 and the pattern layer 118D (e.g., in the Z direction). In an embodiment, the fifth wire WL5 may be disposed between the second inorganic layer PVX2 and the pattern layer 118D (e.g., in the Z direction). For example, as shown in the embodiment of FIG. 11, a lower surface of the fifth wire WL5 may directly contact an upper surface of the second inorganic layer PVX2. The fifth wire WL5 may be electrically connected to the fourth wire WL4 through a contact hole in the second organic insulating layer 116 and/or a contact hole in the second inorganic layer PVX2. In an embodiment, the fifth wire WL5 may include a conductive oxide such as at least one compound selected from ITO, IZO, ZnO, $In_2O_3$, IGO, and AZO. However, embodiments of the present inventive concepts are not limited thereto. For example, in an embodiment, the fifth wire WL5 may include a reflective layer including Ag, Mg, Al, Pt, Pd, Au, Ni, Nd, Ir, Cr, or a compound thereof. In an embodiment, the fifth wire WL5 may further include a layer including ITO, IZO, ZnO, or $In_2O_3$ on/under the reflective layer described above.

As shown in the embodiment of FIG. 11, the wire WL overlapping the dam portion DAM may be provided. The wire WL may include the first to fifth wires WL1 to WL5 electrically connected to each other through the contact holes in the insulating layers. Accordingly, the resistance of the wire WL may be reduced without increasing the width of the wire WL. Also, the boundary between the first display area DA1 and the third display area DA3 may be prevented or reduced from being visually recognized.

In an embodiment, the wire WL may extend to the first display area DA1 from the connection area CA of the second display area DA2 described with reference to the embodiments of FIGS. 6 and 7. In this embodiment, the width of the connection area CA may be relatively small to widen the size of the through portion. According to an embodiment of the present inventive concepts, the first to fifth wires WL1 to WL5 electrically connected to the contact holes of the insulating layers may be provided. Accordingly, the width of the connection area CA may be maintained to be relatively small.

In an embodiment, similar to the wire WL, an intermediate wire MWL overlapping the intermediate dam portion MDAM may be arranged in the third display area DA3. The intermediate wire MWL may be configured to transmit a power voltage and/or a signal to the pixel circuit. In an embodiment, the intermediate wire MWL may include a first intermediate wire to a fifth intermediate wire electrically connected to each other through the contact holes in the insulating layers. The first intermediate wire to the fifth intermediate wire may be similarly disposed on the insulating layers as the first to fifth wires WL1 to WL5. Accordingly, the resistance of the intermediate wire MWL may be reduced without increasing the width of the intermediate wire MWL. Also, a boundary between the third organic light-emitting diodes OLED3 may be prevented or reduced from being visually recognized.

Figure 12A:
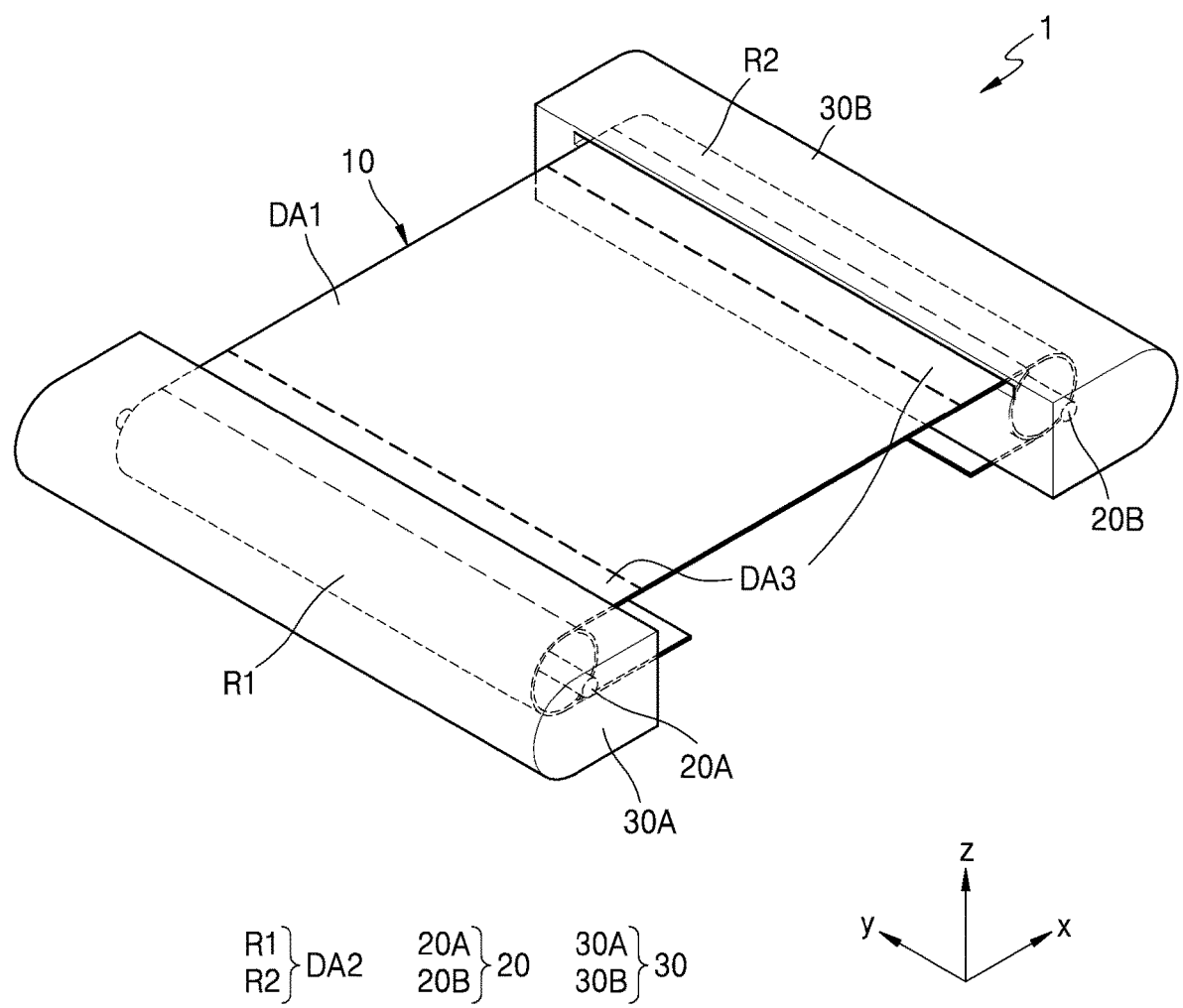

FIGS. 12A and 12B are schematic perspective views of a display device 1, according to an embodiment. FIG. 12A is a perspective view of a first state in which the second display area DA2 is rolled. FIG. 12B is a perspective view of a second state in which the second display area DA2 is unrolled. In FIGS. 12A and 12B, the same reference numerals as those in FIGS. 1A and 1B denote the same elements, and thus redundant descriptions thereof will be omitted for convenience of explanation.

Referring to the embodiments of FIGS. 12A and 12B, the display device 1 may include the display panel 10, the roller 20, and the cover 30.

The display panel 10 may display an image. The display panel 10 may include the first display area DA1, the second display area DA2, and the third display area DA3.

The second display area DA2 may include a first region R1 and a second region R2. The first region R1 and the second region R2 may be arranged with the first display area DA1 therebetween. For example, as shown in the embodiments of FIGS. 12A-12B, the first region R1 may extend from a first lateral side of the first display area DAL. The second region R2 may extend from the opposite second lateral side of the first display area DAL. The third region DA3 may be disposed between the first and second lateral sides of the first display area DA1 and the first and second regions R1, R2 of the second display area DA2, respectively.

The roller 20 may roll the second display area DA2 therearound. In an embodiment, the roller 20 may include a first roller 20A and a second roller 20B. The first roller 20A and the second roller 20B may be spaced apart from each other (e.g., in the X direction) with the first display area DA1 therebetween. In an embodiment, the first roller 20A may roll the first region R1 therearound. The second roller 20B may roll the second region R2 therearound.

The cover 30 may accommodate the roller 20. In an embodiment, the cover 30 may include a first cover 30A and a second cover 30B. The first cover 30A and the second cover 30B may be spaced apart from each other (e.g., in the X direction) with the first display area DA1 therebetween. The first cover 30A may accommodate the first roller 20A. The second cover 30B may accommodate the second roller 20B.

The display device 1 may include the first state and the second state. The first state may be a state in which the second display area DA2 is rolled around the roller 20. The second state may be a state in which the second display area DA2 is at least partially unrolled from the roller 20.

Referring to the embodiment of FIG. 12A, the first region R1 may be rolled around the first roller 20A in the first state. In this embodiment, the first region R1 may be accommodated in the first cover 30A. In an embodiment, the second region R2 may be rolled around the second roller 20B in the first state. In this embodiment, the second region R2 may be accommodated in the second cover 30B. In the first state, the first display area DA1 and the third display area DA3 may display an image. A user may not be able to visually recognize at least one of the first region R1 and the second region R2 in the first state.

Referring to the embodiment of FIG. 12B, the first region R1 may be unrolled from the first roller 20A in the second state. In this embodiment, the first region R1 may be exposed to the outside. In an embodiment, the second region R2 may be unrolled from the second roller 20B in the second state. In this embodiment, the second region R2 may be exposed to the outside. Accordingly, the display device 1 may provide a wide display area to a user in the second state.

Though it is shown in FIG. 12B that both the first region R1 and the second region R2 are exposed to the outside, embodiments of the present inventive concepts are not limited thereto. For example, in an embodiment, any one of the first region R1 and the second region R2 may be exposed to the outside, and the other of the first region R1 and the second region R2 may not be exposed to the outside. Additionally, the first region R1 and the second region R2 may be only partially exposed to the outside in the second state in some embodiments.

As described above, the display panel according to an embodiment of the present inventive concepts may include a first display area, and a second display area including a through portion. Therefore, the occurrence of cracks caused during movement of the second display area along a curved surface of a roller may be prevented or reduced.

It should be understood that the embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the present inventive concepts.

What is claimed is:

1. A display panel comprising a first display area, a second display area including a through portion, and a third display area disposed between the first display area and the second display area, the display panel further comprising:
    a substrate extending continuously from the first display area to the third display area, wherein the through portion separates the substrate in the second display area;
    a plurality of display elements arranged on the substrate, the plurality of display elements including a first display element arranged in the first display area, a second display element arranged in the second display area, and a plurality of third display elements arranged in the third display area; and
    an organic insulating layer arranged between the substrate and the plurality of display elements, and including a second display area hole disposed between the second display element and the through portion, and a third display area hole disposed between adjacent third display elements of the plurality of third display elements.

2. The display panel of claim 1, further comprising:
    an inorganic insulating layer disposed between the substrate and the organic insulating layer, wherein the inorganic insulating layer extends continuously from the first display area to the third display area, the through portion separates the inorganic insulating layer in the second display area.

3. The display panel of claim 1, further comprising:
a pattern layer arranged on the organic insulating layer,
wherein the pattern layer is disposed between the first display element and at least one of the plurality of third display elements that faces the first display element.

4. The display panel of claim 3, further comprising:
an encapsulation layer arranged on the plurality of display elements, the encapsulation layer including at least one inorganic encapsulation layer and at least one organic encapsulation layer,
wherein the pattern layer separates the at least one organic encapsulation layer.

5. The display panel of claim 3, further comprising:
a pixel circuit electrically connected to any one of the plurality of display elements; and
a wire disposed between the substrate and the pattern layer,
wherein the wire is electrically connected to the pixel circuit.

6. The display panel of claim 1, further comprising:
an intermediate pattern layer arranged on the organic insulating layer,
wherein the intermediate pattern layer is disposed between the adjacent third display elements of the plurality of third display elements.

7. The display panel of claim 1, further comprising:
an inorganic layer disposed between the organic insulating layer and the plurality of third display elements,
wherein the inorganic layer includes a protruding tip protruding to wards a center of the third display area hole.

8. The display panel of claim 1, wherein:
the second display area includes a first pixel area, a second pixel area, and a connection area extending from the first pixel area to the second pixel area; and
an edge of the first pixel. area, an edge of the connection area, and an edge of the second pixel area define at least a partial portion of the through portion.

9. The display panel of claim 1, wherein:
the second display area includes a first sub-display area and a second sub-display area;
the through portion includes a first through portion overlapping the first sub-display area, and a second through portion overlapping the second sub-display area, and
an area of the first through portion is greater than an area of the second through portion.

10. The display panel of claim 1, wherein:
the third display area includes a first intermediate display area and a second intermediate display area;
the first intermediate display area is arranged closer to the first display area than the second intermediate display area; and
a density of the plurality of third display elements arranged in the first intermediate display area is greater than a density of the plurality of third display elements arranged in the second intermediate display area.

11. A display device comprising:
a display panel including a first display area and a second display area, each of the first and second areas having a plurality of pixels; and
a roller for rolling the second display area therearound,
wherein the second display area includes a through portion entirely penetrating the display panel, the through portion separates portions of the display panel in the second display area from each other.

12. The display device of claim 11, wherein:
the second display area includes a first pixel area, a second pixel area, and a connection area extending from the first pixel area to the second pixel area; and
an edge of the first pixel area, an edge of the connection area, and an edge of the second pixel area define at least a partial portion of the through portion.

13. The display device of claim 11, wherein the display panel further includes:
a substrate;
an organic insulating layer arranged on the substrate, the organic insulating layer including a second display area hole overlapping the second display area;
a plurality of display elements arranged on the organic insulating layer, the plurality of display elements includes a first display element arranged in the first display area, and a second display element arranged in the second display area; and
an inorganic layer overlapping the second display area, the inorganic layer is arranged between the organic insulating layer and the second display element, wherein the inorganic layer includes a protruding tip protruding towards a center of the second display area hole.

14. The display device of claim 11, wherein:
the display panel further includes a third display area disposed between the first display area and the second display area, the display panel further including:
a substrate extending continuously from the first display area to the third display area, the through portion separates the substrate in the second display area;
a plurality of display elements arranged on the substrate, the plurality of display elements including a first display element arranged in the first display area, a second display element arranged in the second display area, and a plurality of third display elements arranged in the third display area;
an encapsulation layer arranged on the plurality of display elements, the encapsulation layer including at least one inorganic encapsulation layer and at least one organic encapsulation layer; and
a pattern layer disposed between the first display element and at least one of the plurality of third display elements that faces the first display element, the pattern layer separating the at least one organic encapsulation layer.

15. The display device of claim 14, wherein the display panel further includes:
a pixel circuit electrically connected to any one of the plurality of display elements; and
a wire disposed between the substrate and the pattern layer,
wherein the wire is electrically connected to the pixel circuit.

16. The display device of claim 11, wherein:
the display panel further includes a third display area disposed between the first display area and the second display area;
the third display area includes a first intermediate display area and a second inte ediate display area;
the first intermediate display area is arranged closer to the first display area than the second intermediate display area; and a density of sub-pixels arranged in the first intermediate display area is greater than a density of sub-pixels arranged in the second intermediate display area.

17. The display device of claim 11, comprising:

the display device is configured to operate in a first state in which the second display area is rolled around the roller; and the display device is configured to operate in a second state in which the second display area is at least partially unrolled from the roller.

18. The display device of claim 17, wherein:

the second display area includes a first sub-display area that is in direct contact with the roller in the first state, and a second sub-display area that extends away from the first sub-display area in the first state;

the through portion includes a first through portion overlapping the first sub-display area, and a second through portion overlapping the second sub-display area; and an area of the first through portion is greater than an area of the second through portion.

19. The display device of claim 18, wherein, in the first state, at least a portion of the second sub-display area is arranged under the first display area.

20. The display device of claim 11, wherein:

the second display area includes a first area and a second area arranged with the first display area disposed therebetween;

the roller includes a first roller and a second roller;

the first roller rolls the first area therearound; and the second roller rolls the second area therearound.

* * * * *